US012604526B2

(12) United States Patent  
Liu et al.

(10) Patent No.: US 12,604,526 B2  
(45) Date of Patent: Apr. 14, 2026

(54) DISPLAY PANEL AND FABRICATION METHOD THEREOF, AND DISPLAY APPARATUS

(71) Applicant: Shanghai Tianma Micro-Electronics Co., Ltd., Shanghai (CN)

(72) Inventors: Xiaoli Liu, Xiamen (CN); Yuqin Li, Wuhan (CN); Cao Liu, Xiamen (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 590 days.

(21) Appl. No.: 17/989,342

(22) Filed: Nov. 17, 2022

(65) Prior Publication Data

US 2024/0038781 A1 Feb. 1, 2024

(30) Foreign Application Priority Data

Jul. 29, 2022 (CN) .......................... 202210911190.7

(51) Int. Cl.
| | |
|---|---|
| *H10D 86/60* | (2025.01) |
| *H01L 23/00* | (2006.01) |
| *H01L 25/16* | (2023.01) |
| *H10D 86/01* | (2025.01) |
| *H10D 86/40* | (2025.01) |

(52) U.S. Cl.
CPC ............. *H10D 86/60* (2025.01); *H01L 24/05* (2013.01); *H01L 24/81* (2013.01); *H01L 25/167* (2013.01); *H10D 86/0231* (2025.01); *H10D 86/451* (2025.01); *H01L 24/13*

(2013.01); *H01L 24/16* (2013.01); *H01L 2224/05571* (2013.01); *H01L 2224/05583* (2013.01); *H01L 2224/05624* (2013.01); *H01L 2224/05666* (2013.01); *H01L 2224/13021* (2013.01); *H01L 2224/13144* (2013.01); *H01L 2224/16147* (2013.01); *H01L 2224/81002* (2013.01); *H01L 2224/81801* (2013.01)

(58) Field of Classification Search
None
See application file for complete search history.

(56) References Cited

U.S. PATENT DOCUMENTS

| | | | |
|---|---|---|---|
| 2022/0069165 A1* | 3/2022 | Shin | .................... H01L 25/0753 |
| 2022/0115470 A1* | 4/2022 | Kim | ...................... H10K 71/00 |
| 2022/0278253 A1* | 9/2022 | Yang | ................... H01L 25/0753 |

* cited by examiner

*Primary Examiner* — Bo B Jang

(74) *Attorney, Agent, or Firm* — Anova Law Group, PLLC

(57) ABSTRACT

A display panel, a fabrication method of the display panel, and a display apparatus are provided in the present disclosure. The display panel includes a substrate; a drive substrate on the substrate, where the drive substrate includes a first film layer; and the first film layer includes a first opening; and a light-emitting element on the drive substrate, where the light-emitting element is disposed corresponding to the first opening. The drive substrate further includes an auxiliary film layer; and the auxiliary film layer includes a thickened part, a thinned part, or a hollow part overlapped with the first opening.

29 Claims, 22 Drawing Sheets

100

320

321    322

310

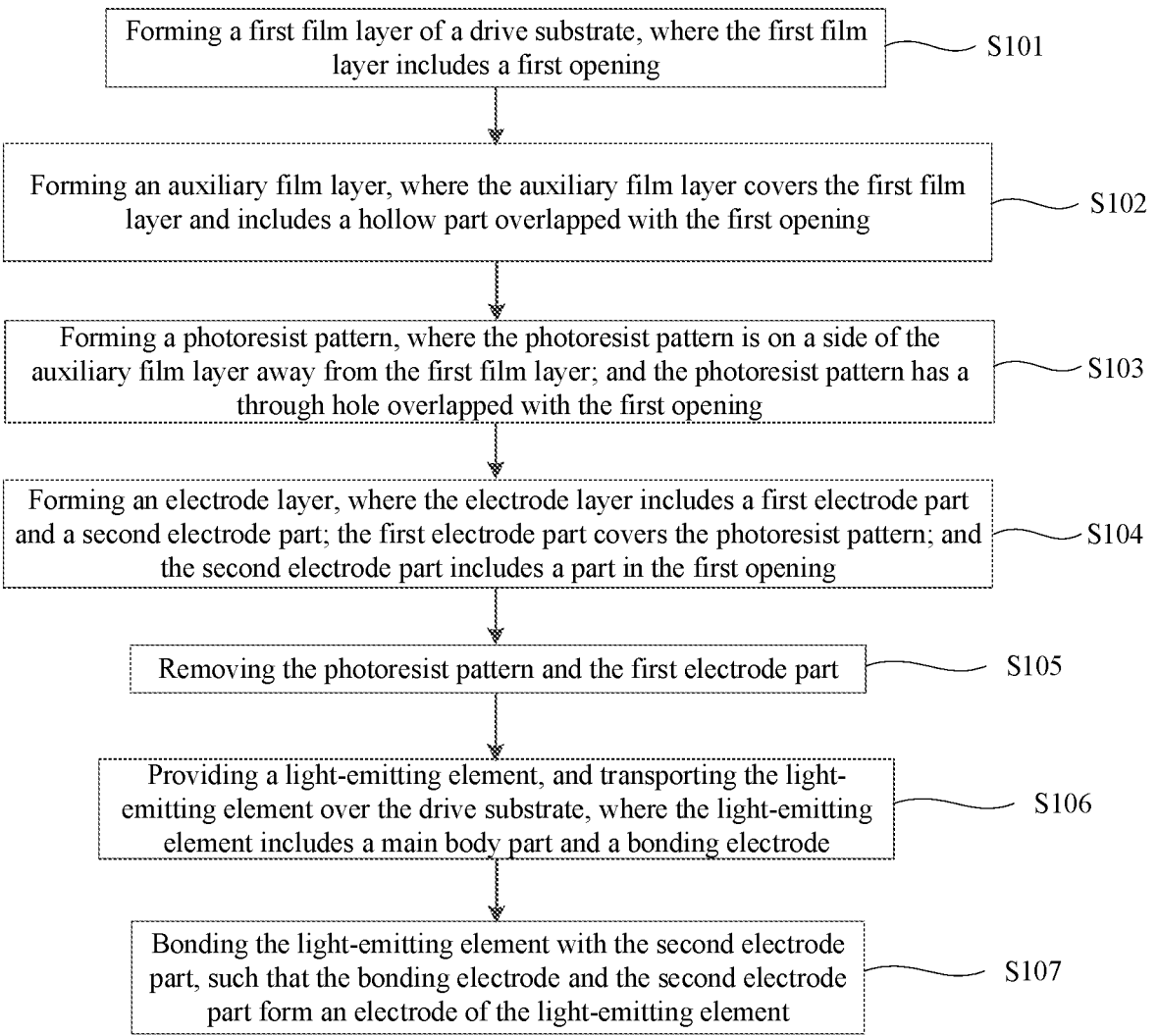

Forming a first film layer of a drive substrate, where the first film layer includes a first opening                                    S101

Forming an auxiliary film layer, where the auxiliary film layer covers the first film layer and includes a hollow part overlapped with the first opening                                    S102

Forming a photoresist pattern, where the photoresist pattern is on a side of the auxiliary film layer away from the first film layer; and the photoresist pattern has a through hole overlapped with the first opening                                    S103

Forming an electrode layer, where the electrode layer includes a first electrode part and a second electrode part; the first electrode part covers the photoresist pattern; and the second electrode part includes a part in the first opening                                    S104

Removing the photoresist pattern and the first electrode part                                    S105

Providing a light-emitting element, and transporting the light-emitting element over the drive substrate, where the light-emitting element includes a main body part and a bonding electrode                                    S106

Bonding the light-emitting element with the second electrode part, such that the bonding electrode and the second electrode part form an electrode of the light-emitting element                                    S107

FIG. 9

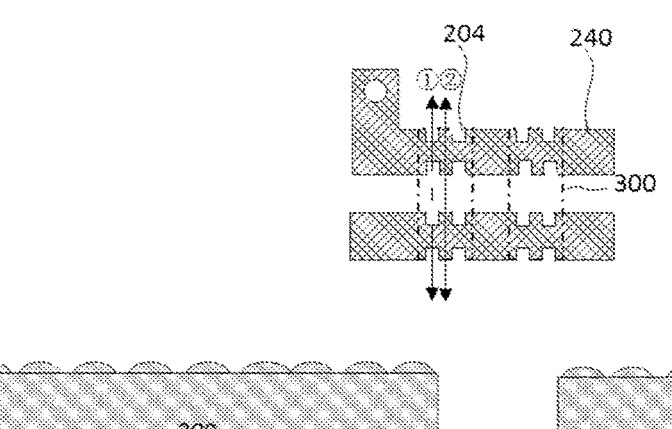
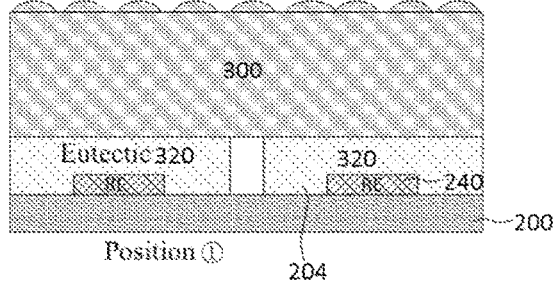
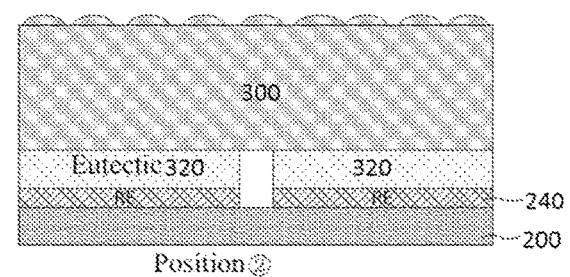
FIG. 35
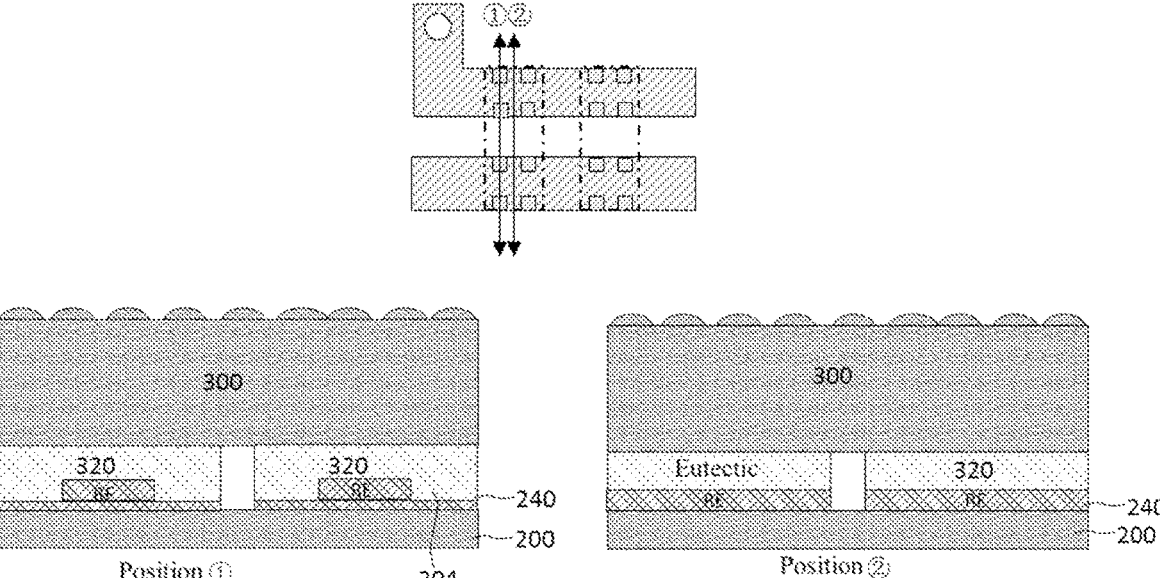
FIG. 36

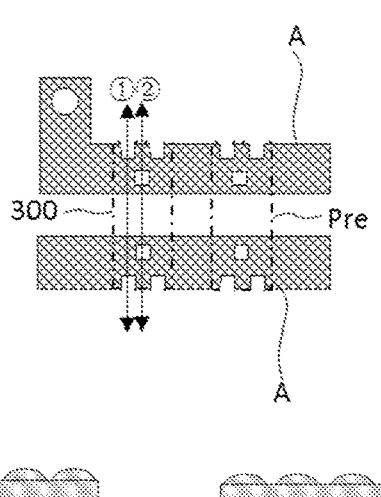
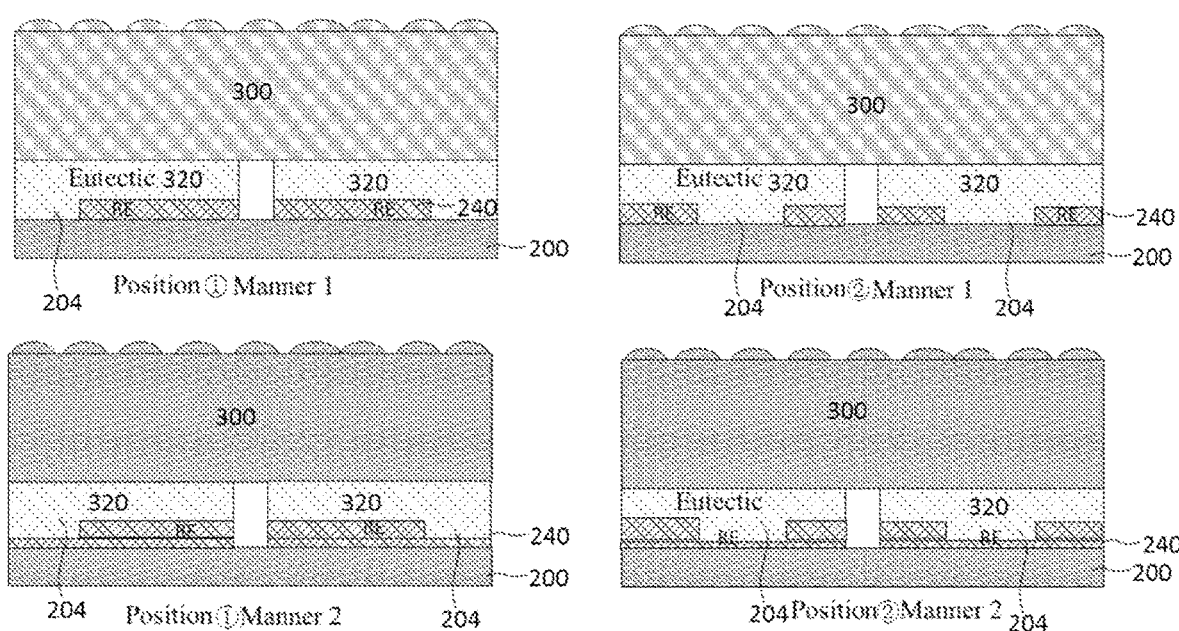
FIG. 38

1000

100

DISPLAY PANEL AND FABRICATION METHOD THEREOF, AND DISPLAY APPARATUS

CROSS-REFERENCE TO RELATED APPLICATION

This application claims the priority of Chinese Patent Application No. 202210911190.7, filed on Jul. 29, 2022, the content of which is incorporated herein by reference in its entirety.

TECHNICAL FIELD

The present disclosure generally relates to the field of display technology and, more particularly, relates to a display panel and a fabrication method thereof, and a display apparatus.

BACKGROUND

With continuous development of display technology, display panels have been widely used. However, the display panels in the existing technology still have certain technical problems that need to be solved urgently. For example, the reliability of the display panels needs to be improved.

SUMMARY

One aspect of the present disclosure provides a display panel. The display panel includes a substrate; a drive substrate on the substrate, where the drive substrate includes a first film layer; and the first film layer includes a first opening; and a light-emitting element on the drive substrate, where the light-emitting element is disposed corresponding to the first opening. The drive substrate further includes an auxiliary film layer; and the auxiliary film layer includes a thickened part, a thinned part, or a hollow part overlapped with the first opening.

Another aspect of the present disclosure provides a display apparatus including a display panel. The display panel includes a substrate; a drive substrate on the substrate, where the drive substrate includes a first film layer; and the first film layer includes a first opening; and a light-emitting element on the drive substrate, where the light-emitting element is disposed corresponding to the first opening. The drive substrate further includes an auxiliary film layer; and the auxiliary film layer includes a thickened part, a thinned part, or a hollow part overlapped with the first opening.

Another aspect of the present disclosure provides a fabrication method of a display apparatus. The method includes forming a first film layer of a drive substrate, where the first film layer includes a first opening; forming an auxiliary film layer, where the auxiliary film layer covers the first film layer and includes a hollow part overlapped with the first opening; forming a photoresist pattern, where the photoresist pattern is on a side of the auxiliary film layer away from the first film layer and includes a through hole overlapped with the first opening; forming an electrode layer, where the electrode layer includes a first electrode part and a second electrode part; the first electrode part covers the photoresist pattern; and the second electrode part includes a part in the first opening; removing the photoresist pattern and the first electrode part; providing a light-emitting element, and transporting the light-emitting element over the drive substrate, where the light-emitting element includes a main body part and a bonding electrode; and bonding the light-emitting element with the second electrode part, such that the bonding electrode and the second electrode part form an electrode of the light-emitting element.

Other aspects of the present disclosure may be understood by those skilled in the art in light of the description, the claims, and the drawings of the present disclosure.

BRIEF DESCRIPTION OF THE DRAWINGS

In order to clearly illustrate technical solutions in embodiments of the present disclosure or related technologies, accompanying drawings required for the description of embodiments or the existing technology are briefly described hereinafter. Obviously, accompanying drawings in following description are only for embodiments of the present disclosure. For those skilled in the art, other drawings may also be obtained according to provided drawings without any creative effort.

FIG. 9 illustrates a flowchart of a fabrication method of a display panel according to various embodiments of the present disclosure.

FIGS. 32-38 respectively illustrate local enlarged schematics and related cross-sectional views of a display panel.

DETAILED DESCRIPTION

Figure 1:
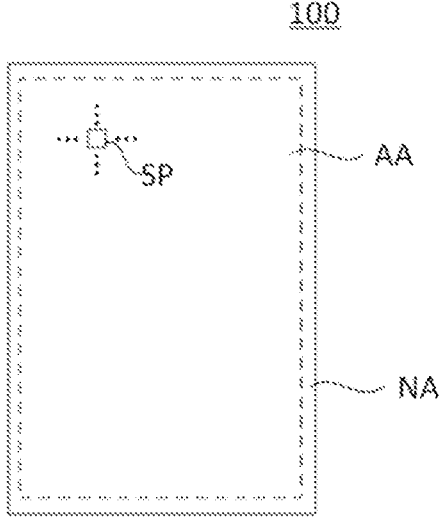
FIG. 1 illustrates a top view of a display panel according to various embodiments of the present disclosure.

In order to make above objectives, features and advantages of the present disclosure more clearly understood, the present disclosure is further described below with reference to the accompanying drawings and embodiments.

It should be noted that specific details are set forth in the following description in order to facilitate a thorough understanding of the present disclosure. However, the present disclosure may be implemented in various other ways different from those described herein, and those skilled in the art may make similar promotions without departing from the connotation of the present disclosure. Accordingly, the present disclosure is not limited by specific embodiments disclosed below.

The terms used in embodiments of the present disclosure are only for the purpose of describing specific embodiments and are not intended to limit the present disclosure. As used in embodiments of the present disclosure and the appended claims, the singular forms "a", "said" and "the" are intended to include the plural forms as well, unless the context clearly dictates otherwise.

It should be noted that directional terms such as "up", "down", "left", "right" described in embodiments of the present disclosure are described from the angles shown in the drawings and should not be understood as the limitation of the present disclosure. In addition, in the context, it also should be understood that when an element is referred to as being formed "on" or "under" another element, it may not only be directly formed "on" or "under" the other element, but also indirectly formed "on" or "under" another element through intermediate elements.

Furthermore, exemplary embodiments may be embodied in various forms and should not be understood as the limitation of embodiments set forth herein; rather, these embodiments are provided to make the present disclosure thorough and complete, and fully convey the concept of exemplary embodiments to those skilled in the art. Same reference numerals in the drawings denote same or similar structures, and thus their repeated descriptions are omitted. The terms expressing position and direction described in the present disclosure are all described by taking the accompanying drawings as an example, but changes may also be made as required, and the changes may all be included in the protection scope of the present disclosure. The drawings of the present disclosure are only used to illustrate relative positional relationship, and the layer thicknesses of some parts are drawn in an exaggerated manner to facilitate understanding. The layer thicknesses in the drawings may not represent proportional relationship of actual layer thicknesses. Also, embodiments of the present disclosure and the features of embodiments may be combined with each other without conflict. The drawings of various embodiments in the present disclosure use same reference numerals. In addition, similarities between various embodiments may not be repeated.

Figure 2:
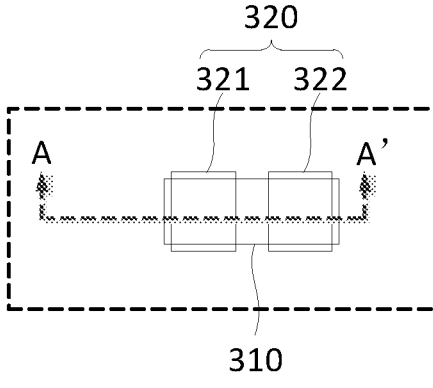
FIG. 2 illustrates an enlarged schematic of a local region of a display region in FIG. 1.
Figure 3:
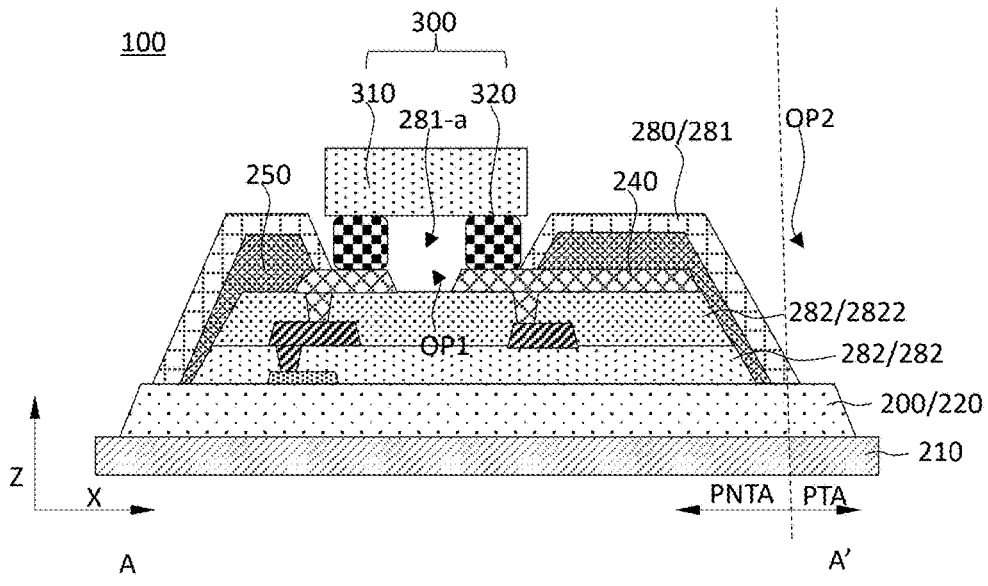
FIG. 3 illustrates a local cross-sectional view along a line AA' in FIG. 2.
Figure 4:
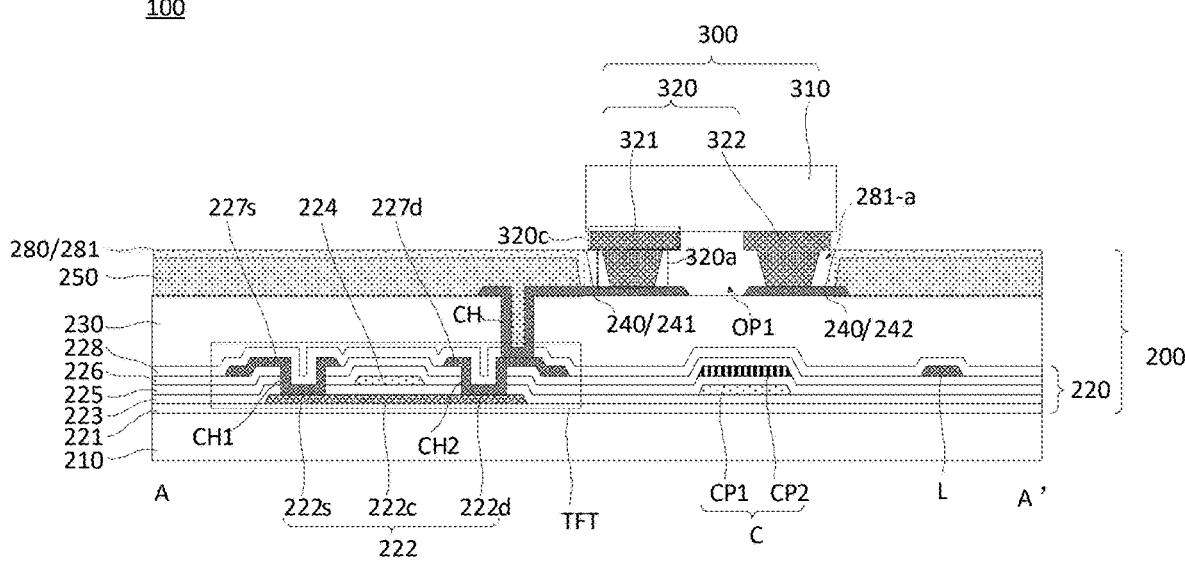
FIG. 4 illustrates another local cross-sectional view along a line AA' in FIG. 2.

Referring to FIGS. 1-2, FIG. 1 illustrates a top view of a display panel according to various embodiments of the present disclosure; and FIG. 2 illustrates an enlarged schematic of a local region of a display region in FIG. 1. FIG. 3 illustrates a local cross-sectional view along a line AA' in FIG. 2. FIG. 4 illustrates another local cross-sectional view along a line AA' in FIG. 2.

Optionally, the display panel 100 may be divided into a display region AA and a non-display region NA surrounding the display region AA. It may be understood that the dotted box in FIG. 1 is used to indicate the boundary between the display region AA and the non-display region NA. The display region AA may be a region used by the display panel for displaying pictures, and normally may include a plurality of pixels sp arranged in an array. The pixel sp may include a light-emitting element (e.g., a diode) and a control element (e.g., a thin film transistor including a pixel drive circuit) which are corresponding to the pixel. The non-display region NA may surround the display region AA, and normally may include peripheral drive elements, peripheral wirings, and a fan-out region.

Optionally, the display panel 100 may include a substrate 210.

Optionally, the substrate 210 may be made of a polymer material including glass, polyimide (PI), polycarbonate (PC), polyethersulfone (PES), polyethylene terephthalate (PET), polyethylene naphthalene ethylene glycol formate (PEN), polyarylate (PAR), glass fiber reinforced plastic (FRP), and/or any other suitable material(s). Substrate 210 may be transparent, translucent, or opaque.

Optionally, the substrate 210 may be flexible or rigid. It should be noted that when a certain film layer is located "on" a certain reference film layer in embodiments of the present disclosure, it may be understood that the reference film layer is "on the side away from the substrate"; unless otherwise specified, "on" may only indicate a directional relationship and may not indicate that two film layers are necessarily adjacent or contacting film layers.

The drive substrate 200 may be on the side of the substrate 210 facing the display surface or the touch surface of the display panel 100.

The drive substrate 200 may also include a drive circuit layer 220, and the drive circuit layer 220 may be on the substrate 210. FIG. 4 illustrates another local cross-sectional view along a line AA' in FIG. 2. In some optional embodiments, FIG. 4 may be used for describing the related structure of the drive circuit layer 220 in FIG. 3.

Optionally, the drive circuit layer 220 may include structures such as thin film transistors TFT, capacitors C, wirings L, and the like.

In one embodiment, the film layers of the drive circuit layer 220 may include a buffer layer 221, an active pattern 222, a gate insulating layer 223, a gate electrode 224, an intermediate dielectric layer 225, an interlayer dielectric layer 226, a source electrode 227_s_, a drain electrode 227_d_, and a passivation layer 228.

The buffer layer 221 may prevent impurities such as oxygen, moisture and the like from permeating from the substrate 210 and may planarize the substrate 210. In addition, the buffer layer 221 may control the heat transport rate in the annealing process for the formation of the active pattern 222. The buffer layer 221 may include a stacked structure including one or more inorganic materials such as silicon oxide, silicon nitride, silicon oxynitride, and the like.

The drive circuit layer 220 may include a plurality of thin film transistors TFT, and the thin film transistors may form a pixel circuit for light-emitting devices in the display layer.

A top-gate thin film transistor is taken as a structure example in embodiments of the present disclosure. The thin film transistor layer TFT may include the active pattern 222 on the substrate 210. The active pattern 222 may include a silicon semiconductor or an oxide semiconductor.

The silicon semiconductor may include one or more of amorphous silicon, single crystal silicon, and polycrystalline silicon. Exemplarily, the active pattern 222 may include low temperature polycrystalline silicon.

When the active pattern 222 is made of a polycrystalline silicon material, the active pattern 222 may be formed by using a low temperature amorphous silicon technology, that is, an amorphous silicon material may be melted by the laser to form the polycrystalline silicon material. In addition, other manners such as rapid thermal annealing (RTA), solid phase crystallization (SPC), excimer laser annealing (ELA), metal induced crystallization (MIC), metal induced lateral crystallization (MILC), and/or continuous lateral solidification (SLS) may also be used.

The active pattern 222 may further include source and drain regions formed by doping N-type impurity ions or P-type impurity ions; and a channel region may be between the source and drain regions.

When the active pattern 222 includes an oxide semiconductor, the oxide semiconductor may include indium (In), zinc (Zn), gallium (Ga), tin (Sn), titanium (Ti), aluminum (Al), hafnium (Hf), Zirconium (Zr), Magnesium (Mg), and/or the like. The active pattern 222 may include binary compounds, ternary compounds or quaternary compounds. For example, the active pattern 222 may include indium gallium zinc oxide (IGZO), indium tin zinc oxide (ITZO), gallium zinc oxide (GaZnxOy), indium zinc oxide (IZO), zinc magnesium oxide (ZnMgxOy), zinc oxide (ZnOx), gallium oxide (GaOx), tin oxide (SnOx), indium oxide (InOx), indium gallium hafnium oxide (IGHO), tin aluminum zinc oxide (TAZO), indium gallium tin oxide (IGTO), and/or the like. Above-mentioned materials may be used alone or also be used in combination with each other. In exemplary implementation manners of the present disclosure, above-mentioned oxide semiconductor may be doped with lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), and/or the like.

Optionally, the gate insulating layer 223 may be on the active pattern 222. The gate insulating layer 223 may include an inorganic layer such as silicon oxide or silicon nitride and may be a single layer or multiple layers.

Optionally, the gate electrode 224 may be on the gate insulating layer 223. The gate electrode 224 may a single layer or multiple layers including gold (Au), silver (Ag), copper (Cu), nickel (Ni), platinum (Pt), palladium (Pd), aluminum (Al), molybdenum (MO), or chromium (Cr), or may be an alloy such as an aluminum (Al): neodymium (Nd) alloy and a molybdenum (MO): tungsten (W) alloy.

The intermediate dielectric layer 225 may cover the gate electrode 224 and be disposed on the gate insulating layer 223. The intermediate dielectric layer 225 may include a stacked structure including one or more inorganic materials such as silicon oxide, silicon nitride, silicon oxynitride and the like. Exemplarily, the intermediate dielectric layer 225 may include silicon nitride.

The interlayer dielectric layer 226 may be disposed on the intermediate dielectric layer 225. The interlayer dielectric layer 226 may include a stacked structure including one or more inorganic materials such as silicon oxide, silicon nitride, silicon oxynitride and the like.

The source electrode 227s may be in contact with the source region 222s of the active pattern 222, and the drain electrode 227d may be in contact with the drain region 222d of the active pattern 222. The source electrode 227s and the drain electrode 227d may be formed in a same process; and both the source electrode 227s and the drain electrode 227d may be in a same film layer. In one embodiment, the first contact hole CH1 exposing a part of the source region 222s and the second contact hole CH2 exposing a part of the drain region 222d may be formed through the gate insulating layer 223, the intermediate dielectric layer 225 and the interlayer dielectric layer 226, respectively. The source electrode 227s may in contact with the upper surface of the source region 222s through the first contact hole CH1, and the drain electrode 227d may in contact with the upper surface of the drain region 222d through the second contact hole CH2. The source electrode 227s and the drain electrode 227d may be made of metals such as aluminum (Al), silver (Ag), chromium (Cr), titanium (Ti), tantalum (Ta), molybdenum (Mo) and the like, alloys thereof, nitrides thereof, conductive metal oxides, transparent conductive materials, and/or the like. In one embodiment, the source electrode 227s and the drain electrode 227d may include a Ti/Ai/Ti metal stacked structure.

The passivation layer 228 may cover the source electrode 227s and the drain electrode 227d and may be disposed on the interlayer dielectric layer 226. The passivation layer 228 may include a stacked structure including one or more inorganic materials such as silicon oxide, silicon nitride, silicon oxynitride and the like. In one embodiment, the passivation layer 228 may include silicon nitride.

The capacitor C may include the first electrode plate CP1 and the second electrode plate CP2 which are opposite with each other. The capacitor C may be used to maintain the node potential in the drive circuit. The first electrode plate CP1 may be between the gate insulating layer 223 and the intermediate dielectric layer 225. The first electrode plate CP1 may be in a same film layer as the gate electrode 224 and formed of a same material as the gate electrode 224. The second plate CP2 may be between the intermediate dielectric layer 225 and the interlayer dielectric layer 226. The second plate CP2 may be made of a material including metals such as aluminum (Al), silver (Ag), chromium (Cr), titanium (Ti), tantalum (Ta) and molybdenum (Mo), alloys thereof, nitrides thereof, conductive metal oxides, transparent conductive materials, and the like. In one embodiment, the second plate CP2 may include molybdenum (Mo).

The wiring L may be used to provide various signals. In FIG. 4, the wiring L may be between the interlayer dielectric layer 226 and the passivation layer 228 as an example. The wiring L may be in a same film layer as the source electrode 227s and the drain electrode 227d and made of a same material as the source electrode 227s and the drain electrode 227d. According to the types and requirements of the signals transmitted by the wiring L, the wiring L may be in another film layer or multiple film layers. For example, the wiring L and the gate electrode 224 may be in a same film layer, or the wiring L and the second plate CP2 may be in a same film layer, and so on.

It may be understood that the drive circuit layer 220 may include a drive circuit; and the drive circuit may be used to drive a light-emitting element 300 to emit light. In one embodiment, the drive circuit may include a pixel circuit; and the pixel circuit may be electrically connected to the light-emitting element 300 for drive the light-emitting element 300 to emit light.

Referring to FIGS. 3-4, the drive substrate 200 may further include the planarization layer 230. The planarization layer 230 may be on the drive circuit layer 220 and used to form a flat surface on the drive circuit layer 220. In one embodiment, the planarization layer 230 may be on the passivation layer 228; and a side of the planarization layer 230 away from the passivation layer 228 may have a substantially flat upper surface. The planarization layer 230 may include an organic material such as photoresist, poly-acrylate-based resin, polyimide-based resin, polyamide-based resin, siloxane-based resin, acrylic-based resin, epoxy-based resin, and/or the like.

Optionally, in some embodiments, the planarization layer 230 may include at least two layers; and other conductive layers or other metal layers may be disposed between two planarization layers 230 to play a transition role or a bridge role for electrically connection the thin film transistor TFT and the light-emitting element 300.

The drive circuit layer 220 may be formed by a film stacking manner. In the drive circuit layer 220, patterns of the thin film transistor TFT including the active pattern 222, the gate electrode 224, the source electrode 227s and the drain electrode 227d and other patterns such as the capacitor C and the wiring L may make the upper surface of the drive circuit layer 220 uneven. In addition, the through holes (such as the first contact hole CH1, the second contact hole CH2 and the like) passing through the film layer may also bring the problem of unevenness on the upper surface of the drive circuit layer 220. The upper surface of the drive circuit layer 220 may be the upper surface of the passivation layer 228. By disposing the planarization layer 230, a flat surface may be provided for the components to be formed subsequently.

It should be noted that, in some optional embodiments of the present disclosure, the auxiliary film layer 280 may reuse the planarization layer 230.

Referring to FIG. 4, the drive substrate 200 may further include a connection part 240. The connection part 240 may be disposed on the planarization layer 230. The connection part 240 may include the first connection part 241 and the second connection part 242. The first connection part 241 may be electrically connected to the thin film transistor TFT in the drive circuit layer 220, and the second connection part 242 may be electrically connected to the power line. In one embodiment, the first connection part 241 may be electrically connected to the drain electrode 227d of the thin film transistor TFT through the contact hole CH. The contact hole CH may pass through the planarization layer 230 and the passivation layer 228 and may expose a part of the drain electrode 227d of the thin film transistor TFT. The connection part 240 may be made of metals such as aluminum (Al), silver (Ag), chromium (Cr), titanium (Ti), tantalum (Ta), molybdenum (Mo) and the like, and include alloys thereof, nitrides thereof, conductive metal oxides, transparent conductive materials, and/or the like. In one embodiment, the connection part 240 may include a Ti/Ai/Ti metal stack structure. The material of the connection part 240 may be same as the materials of the source electrode 227s and the drain electrode 227d.

In order to fully utilize the metal film layer, the metal film layer where the connection part 240 is located may also include other metal components, such as power lines, signal lines, electrical blocking components, light-blocking components, and/or the like.

Optionally, the drive substrate 200 may further include the first film layer 250; and the first film layer 250 may include the first opening OP1. As shown in FIGS. 3 and 4, the first film layer 250 of the drive substrate 200 may be on the side of the drive circuit layer 220 away from the substrate 210, that is, the drive circuit layer 220 may be between the first film layer 250 and the substrate 210. The planarization layer 230 may be between the first film layer 250 and the drive circuit layer 220. The connection part 240 may be between the planarization layer 230 and the first film layer 250.

Optionally, the display panel 100 may further include the light-emitting element 300 on the drive substrate 200; and the light-emitting element may be disposed corresponding to the first opening OP1.

That is, the first opening OP1 may define the light-emitting element 300, and the light-emitting element 300 may be at least partially in the first opening OP1. In other words, along the first direction X, the first film layer 250 may be at least partially between two adjacent light-emitting elements 300, where the first direction X is a direction in parallel with the plane of the display panel 100.

Optionally, the light-emitting element 300 may be a light-emitting diode, for example, an inorganic light-emitting diode. The size of the light-emitting element 300 may be less than 200 microns. In one embodiment, the size of the light-emitting element 300 may be less than 100 microns, 50 microns, or the like.

Figure 6:
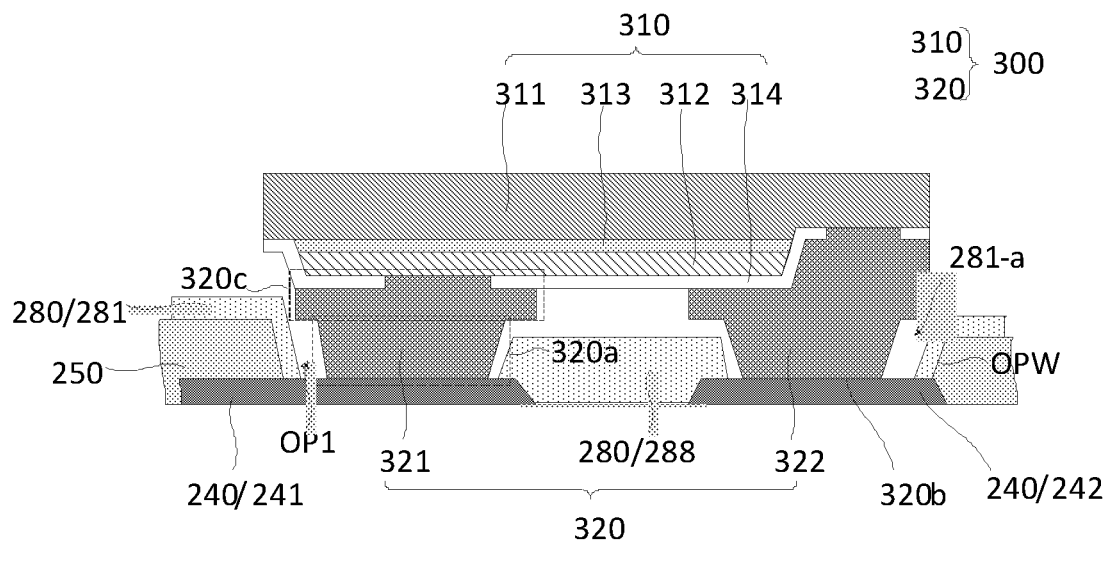
FIG. 6 illustrates an enlarged schematic of a light-emitting element and a local region of a display panel according to various embodiments of the present disclosure.
Figure 7:
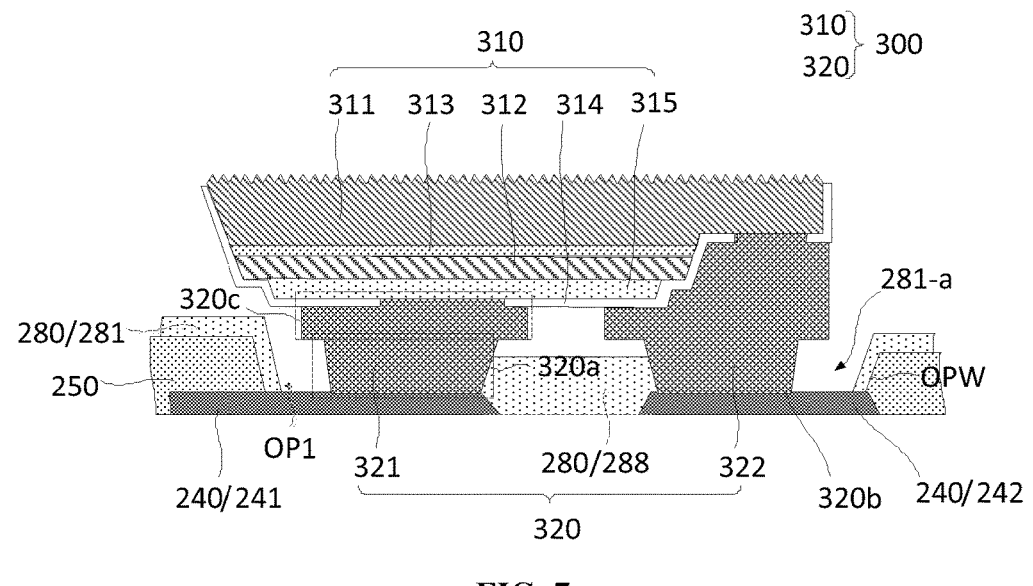
FIG. 7 illustrates another enlarged schematic of a light-emitting element and a local region of a display panel according to various embodiments of the present disclosure.

FIG. 6 illustrates an enlarged schematic of a local region of a light-emitting element and a local region of display panel according to various embodiments of the present disclosure; and FIG. 7 illustrates another enlarged schematic of a local region of a light-emitting element and a local region of display panel according to various embodiments of the present disclosure. Only some film layers in the drive substrate 200 are illustrated in FIGS. 6 and 7.

The light-emitting element 300 may include a main body part 310 and a connection electrode 320. The main body part 310 may include an N-type semiconductor layer 311, a P-type semiconductor layer 312, and an active layer 313 therebetween.

The main body part 310 of the light-emitting element 300 may be understood as a part of the light-emitting element 300 other than the connection electrode 320.

The material of the main body part 310 of the light-emitting element 300 may include, but may not be limited to, compound semiconductors such as gallium nitride (GaN), aluminum indium gallium phosphide (AlInGaP), aluminum gallium arsenide (AlGaAs); and/or gallium arsenide phosphide (GaAsP).

The connection electrode 320 may include the first electrode 321 and the second electrode 322. The first electrode 321 may be electrically connected to the P-type semiconductor layer 312, the second electrode 322 may be electrically connected to the N-type semiconductor layer 311, the first electrode 321 may be a positive electrode, and the second electrode 322 may be a negative electrode.

The connection electrode 320 may be made of a material including an alloy or solid solution of metals such as gold (Au), tin (Sn), nickel (Ni), titanium (Ti), aluminum (Al), silver (Ag), and indium (In). In one embodiment, the connection electrode 320 may include a gold-indium alloy.

The first electrode 321 and the second electrode 322 may both be on a same side of the main body part 310. For example, the first electrode 321 and the second electrode 322 may be both on the side of the N-type semiconductor layer 311 adjacent to the P-type semiconductor layer 312. In the film layer structure of the display panel, both the first electrode 321 and the second electrode 322 may be on the side of the main body part 310 facing the drive substrate 200. When transporting the light-emitting element 300 to the drive substrate 200, it is convenient to realize the electrical connection between the light-emitting element 300 and the drive substrate 200 by a thermocompression manner. For example, the bonding between the light-emitting element 300 and the drive substrate 200 may be realized by a eutectic manner.

The main body part 310 may further include an insulating layer 314. The insulating layer 314 may cover the N-type semiconductor layer 311, the P-type semiconductor layer 312 and the active layer 313 in the main body part. Through holes may be formed in the insulating layer 314 to expose a part of the N-type semiconductor layer 311 and a part of the P-type semiconductor layer 312, respectively. At the through holes of the insulating layer 314, the first electrode 321 may be electrically connected to the P-type semiconductor layer 312, and the second electrode 322 may be electrically connected to the N-type semiconductor layer 311.

The main body part 310 may further include a Bragg reflection layer. The Bragg reflection layer may be on the side of the P-type semiconductor layer 312 away from the N-type semiconductor layer 311 to improve the light extraction efficiency of the light-emitting element 300 by reflecting light.

As shown in FIG. 7, the main body part 310 of the light-emitting element 300 may further include a transparent electrode 315. The transparent electrode 315 may be between the first electrode 321 and the P-type semiconductor layer 312. The material of the transparent electrode 315 may be indium tin oxide (ITO), which may be used to adjust the current density distribution in different regions of the light-emitting element 300.

As shown in FIG. 7, the upper surface of the light-emitting element 300 may be provided with micro-patterns. For example, rough patterns may be provided on the upper surface of the N-type semiconductor layer 311 to improve the light extraction efficiency of the light-emitting element 300.

Referring to FIGS. 3-4 and 6-7, optionally, the first opening OP1 of the first film layer 250 may expose the connection part 240; the connection electrode 320 of the light-emitting element 300 may include the first part 320a in the first opening OP1; the connection electrode 320 of the light-emitting element 300 may be in contact with and electrically connected to the connection part 240; and the first part 320a of the connection electrode 320 of the light-emitting element 300 may be in contact with and electrically connected to the connection part 240.

Optionally, the connection electrode 320 may fill the first opening OP1 of the first film layer 250. The first part 320a of the connection electrode 320 may fill the first opening OP1 of the first film layer 250. For example, the lower surface 320b of the connection electrode 320 may be in contact with the connection part 240.

The upper surface of the connection part 240 may be roughened to increase the adhesion between the connection part 240 and the first part 320a of the connection electrode 320.

The thickness of the first film layer 250 may be adjusted to improve the reliability between the light-emitting element 300 and the drive substrate 200.

The connection electrode 320 may further include the second part 320c between the first part 320a and the main body part 310 of the light-emitting element 300. 1

FIGS. 6 and 7 illustrate the first part 320a and the second part 320c of the first electrode 321. The first part 320a and the second part 320c of the second electrode 322 may be divided in a same manner. That is, the second electrode 322 may include the first part 320a in the first opening OP1 of the first film layer 250 and the second part 320c between the first part 320a and the main body part 310 of the light-emitting element 300.

In the existing technology, the electrode of the light-emitting element may be directly disposed on the metal connection electrode; one end of the metal connection electrode may be connected to a lower thin film transistor through a via in the film layer between the metal connection electrode and the thin film transistor; and the electrode of the light-emitting element may be at the other end of the metal connection electrode. In order to avoid that the position of disposing the via affects the bonding process of the light-emitting element due to the uneven surface caused by the metal connection electrode, a certain distance may need to be reserved between the end of the metal connection electrode at the position of the via and the end of the electrode where the light-emitting element is disposed. Therefore, the length of the metal connection electrode may be long, and the metal connection electrode may increase the reflectivity of the display panel and affect the display effect. In the present disclosure, by disposing the connection electrode 320 of the light-emitting element 300 at the first opening OP1 of the first film layer 250, the reflectivity of the display panel may be reduced, and the display effect of the display panel may be improved.

In embodiments of the present disclosure, the shape of the first opening OP1 of the first film layer 250 may be a rectangle as an example. The shape of the first opening OP1 of the first film layer 250 may also include other suitable shapes such as a circle.

Optionally, in some embodiments of the present disclosure, as shown in FIG. 4, the first electrode 321 of the light-emitting element 300 may be electrically connected to the first connection part 241 and may be electrically connected to the drain electrode 227d of the thin film transistor TFT through the first connection part 241. The first connection part 241 may be connected to the thin film transistor TFT through the contact hole CH passing through the planarization layer 230 and the passivation layer 228. The part of the first connection part 241 located in the contact hole CH may not have a flat surface, and the part of the first connection part 241 exposed by the first opening OP1 of the first film layer 250 may need to have a relatively flat surface, which may be beneficial for bonding of the light-emitting element 300. Along the direction perpendicular to the plane of the display panel 100, the contact hole CH may not be overlapped with the first opening OP1 of the first film layer 250, which may avoid the influence of the contact hole CH on the flat part of the first connection part 241. The distance between the part of the first connection part 241 in the contact hole CH and the part of the first connection part 241 exposed by the first opening OP1 may be configured as requirements.

Referring to related drawings of the present disclosure, optionally, the second electrode 322 of the light-emitting element 300 may be electrically connected to the second connection part 242 and may also be connected to the power line through the second connection part 242.

Optionally, the first film layer 250 may include an organic material. Optionally, the first film layer 250 may be an organic layer. For example, the first film layer 250 may include photoresist, polyacrylate-based resin, polyimide-based resin, polyamide-based resin, siloxane-based resin, acrylic-based resin, epoxy-based resin, and the like. Through such design, on the one hand, the first opening OP1 with a certain depth may be provided to reduce the thickness requirement of the photoresist layer for subsequent patterning of relevant film layers (the photoresist layer mentioned here is described below), thereby reducing process difficulty; on the other hand, the organic first film layer 250 may continue to provide a flat surface above the connection part 240, which may be beneficial for smooth eutectic process between the second electrode part 520 and a bonding electrode 330 (the process refers to following drawings related to above-mentioned structure and is also described below), thereby improving electrode bonding reliability.

Figure 8:
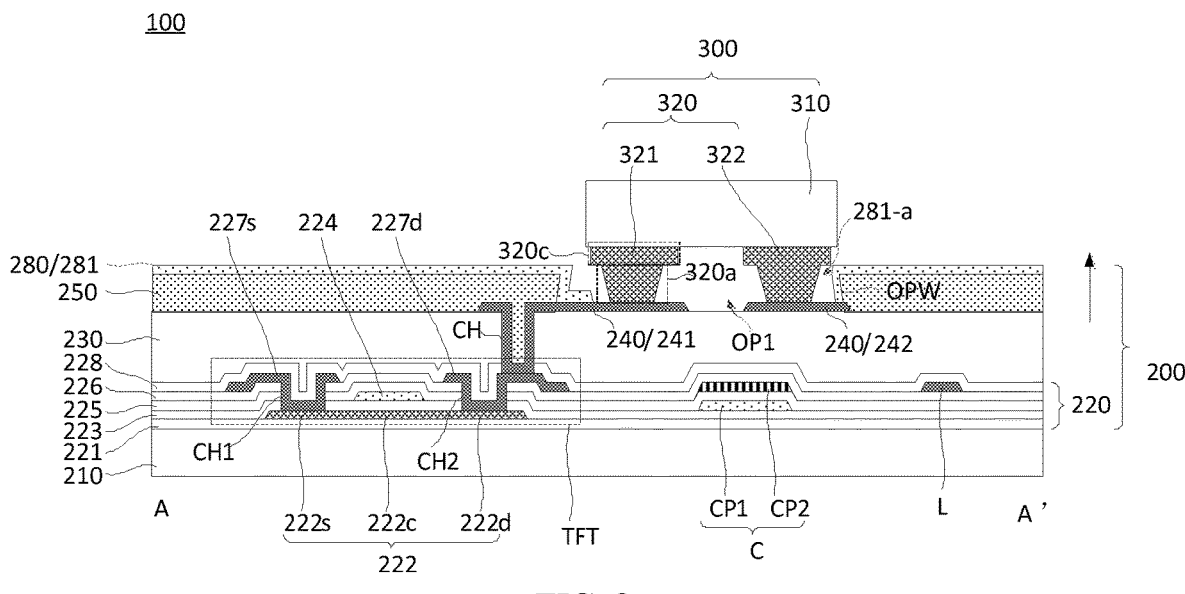
FIG. 8 illustrates another local cross-sectional view along a line AA' in FIG. 2.

Optionally, referring to FIG. 8, FIG. 8 illustrates another local cross-sectional view along a line AA' in FIG. 2; and the cross section is perpendicular to the plane where the display panel is located.

The first film layer 250 may include a negative photoresist. The inventors had found that, for the first film layer 250 formed by using the negative photoresist, during the exposure process, the exposure amount at different thickness positions may be different along the thickness direction. The farther away from the exposure source is, the smaller the exposure is. During the development process, the position where the exposure amount is insufficient may also be easily removed, so that inclined sidewalls may be formed in the first opening OP1 of the first film layer 250.

Optionally, the first film layer 250 may be provided with the first opening OP1, and along the direction from the first film layer 250 to the light-emitting element 300, the sidewall OPW of the first opening OP1 may be inclined toward the inside of the first opening OP1. That is, the area of the top surface of the first opening OP1 (adjacent to the main body part 310 of the light-emitting element 300) may be smaller than the area of the bottom surface of the first opening OP1 (adjacent to the connection part 240).

The connection electrode 320 of the light-emitting element 300 may include the first part 320a filling the first opening OP1, which may cooperate with the inclined configuration of the sidewall OPW of the first opening OP1. Therefore, the ability of the drive substrate 200 to fix the light-emitting element 300 may be improved, and the occurrence probability of the light-emitting element 300 falling off from the drive substrate 200 may be reduced.

Moreover, in some optional processes, the material of the photoresist layer for subsequent patterning of relevant film layers may also be a negative photoresist. In the case where the photoresist layers of the first film layer 250 and subsequent patterning related film layers are all made of a negative photoresist, a mask (such as a same mask) having a same pattern of the light-blocking region may be used to form the first film layer 250 and related photoresist pattern, which may save the cost of mask production.

Referring to any cross-sectional views in the present disclosure, optionally, the first film layer 250 may include a light-absorbing material. The first film layer 250 may be used for blocking light and reduce the reflectivity of the display panel by absorbing external ambient light. For example, the first film layer 250 may include black pigment, that is, the first film layer 250 may be a black layer. In one embodiment, the first film layer 250 may be black photoresist.

Optionally, all other parts of the first film layer 250 may block light except the position where the opening (e.g., the first openings OP1) is disposed. It may be understood that, in some other optional embodiments of the present disclosure, the first film layer may further include other openings as required, such as the second opening OP2 described below; and the position corresponding to the second opening OP2 may also be excluded.

Through one embodiment, on the one hand, the first film layer 250 may greatly reduce the problem of high reflectivity of the display panel caused by the metal components in the drive circuit layer 220; on another hand, the first film layer 250 may also reduce the influence of the external ambient light on the performance of the elements in the drive circuit layer 220, for example, avoid the problem that the external ambient light is incident on the thin film transistor and causes the thin film transistor TFT to generate light leakage; and on another hand, the first film layer 250 may absorb the light emitted from the light-emitting element 300 downward (i.e., toward the substrate 210), thereby preventing such light from being reflected by other components toward the display surface side of the display panel to affect the display effect.

It should be noted that, in some optional embodiments of the present disclosure, above-mentioned embodiments may be combined. For example, the first film layer 250 may be a negative photoresist and also include a light-absorbing material. In other words, the first film layer may be an organic material, and/or the first film layer may be a negative material, and/or the first film layer may include a light-absorbing material. The following non-contradictory embodiments after combination still belong to the solutions described in present disclosure, which may not be described in detail in the present disclosure.

Referring to the drawings related to the cross-sections of the display panel and corresponding top views of the cross-sectional views in the present disclosure, the drive substrate 200 may further include the auxiliary film layer 280. The auxiliary film layer 280 may be on one side of the first film layer 250 along the third direction Z, where the third direction Z is a direction perpendicular to the plane where the display panel 100 is located.

Optionally, the auxiliary film layer 280 may include a part overlapped with the first film layer 250, but the auxiliary film layer 280 may have a structural change at the first opening OP1 of the first film layer 250. The structural change mentioned here refers to the film thickness change of the auxiliary film layer 280 along the third direction Z. It should also be noted that the thickness mentioned here includes the case where the thickness is zero. In other words, the auxiliary film layer 280 may include a first part overlapped with the first film layer 250, and further include a second part overlapped with the first opening OP1 of the first film layer 250. There may be a level difference between the first part and the second part.

It should be noted that the "overlap" of two structures described in one embodiment may be understood as the "overlap" of the orthographic projections of two structures on the substrate 210 (i.e., the orthographic projections along the third direction Z).

Through embodiments of the present disclosure, a thickness difference may be between the first opening and the non-first opening corresponding to the auxiliary film layer, so that the drive substrate at the first opening may be more easily bonded with the light-emitting element than the region of the non-first opening in terms of film structure. Therefore, through the auxiliary film layer provided in one embodiment, the reliability of aligning and bonding of the light-emitting element and the drive substrate at the first opening may be improved, which may be more convenient and stable to align and bond the light-emitting element corresponding to the first opening and the drive substrate.

Optionally, the auxiliary film layer 280 may be adjacent to the first film layer 250. Optionally, the auxiliary film layer 280 may be in contact with the first film layer 250. In such way, the structural change of the auxiliary film layer 280 may be more directly reflected in the first opening OP1 of the first film layer 250, which may desirably assist and enhance aligning and bonding the light-emitting element and the drive substrate and improve the bonding stability.

Optionally, the auxiliary film layer 280 may include a thickened part, and/or a thinned part, and/or a hollow part overlapped with the first opening OP1.

Figure 5:
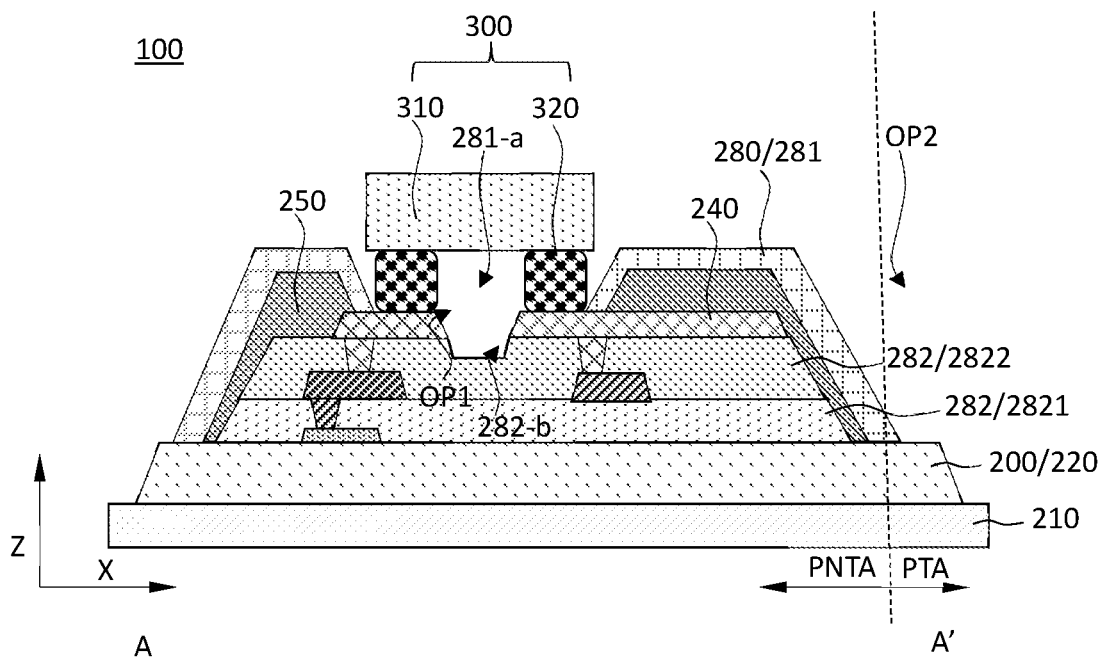
FIG. 5 illustrates another local cross-sectional view along a line AA' in FIG. 2.

Optionally, the auxiliary film layer 280 having a thinned part or a hollow part corresponding to the first opening OP1 is shown in FIG. 3 or FIG. 5, where FIG. 5 illustrates another local cross-sectional view along a line AA' in FIG. 2, and the cross section is perpendicular to the plane where the display panel is located. Optionally, the auxiliary film layer 280 may include a hollow part 281-a overlapped with the first opening OP1 as shown in FIG. 4; and the auxiliary film layer 280 may also include a thinned part 282-b overlapped with the first opening OP1 as shown in FIG. 5. The thickness of the auxiliary film layer 280 at the thinned part or the hollow part may be lost to compensate for the depth of the first opening, which may better guide the light-emitting element to be aligned, better limit the light-emitting element after the alignment and improve alignment stability of the light-emitting element and the drive substrate.

Optionally, when the auxiliary film layer 280 has a thickened part corresponding to the first opening OP1, the light-emitting element may be raised by the thickened part to improve alignment convenience, which may be described in detail below.

Figure 27:
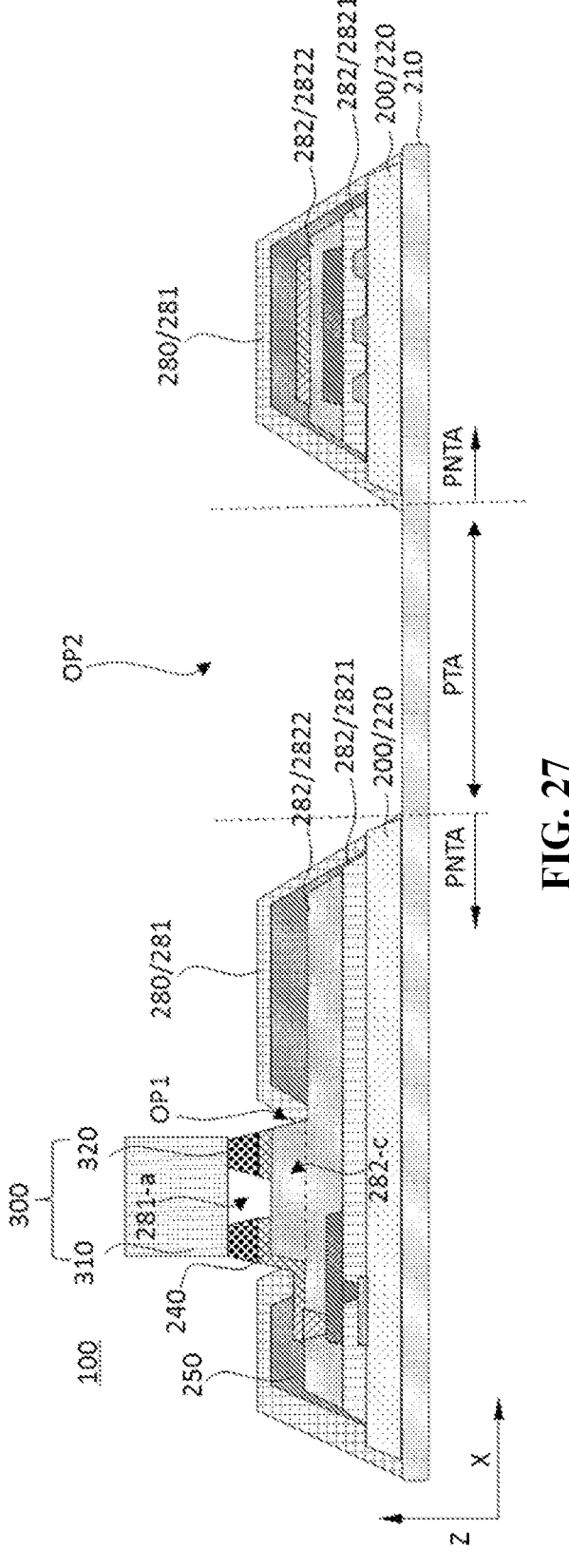
FIG. 27 illustrates a cross-sectional view of a display panel according to various embodiments of the present disclosure.

As shown in FIG. 3, 5 or 27, the auxiliary film layer 280 may include the first auxiliary layer 281 on the side of the first film layer 250 away from the substrate 210; and/or, the auxiliary film layer 280 may include the second auxiliary layer 282 on the side of the first film layer 250 facing the substrate 210.

Optionally, as shown in FIG. 5, the auxiliary film layer 280 may include the second auxiliary layer 282 on the side of the first film layer 250 facing the substrate 210. Optionally, the second auxiliary layer 282 may reuse above-mentioned planarization layer 230.

Optionally, the second auxiliary layer 282 may include a plurality of sub-layers, for example, the first sub-layer 2821 and the second sub-layer 2822 stacked in sequence along the direction of the substrate 210 toward the first film layer 250.

Optionally, the second auxiliary layer 282 may include the thinned part 282-b. For example, the thinned part 282-b of the second auxiliary layer 282 may be formed by a groove with an opening facing the light-emitting element 300.

Optionally, when the second auxiliary layer 282 includes a plurality of sublayers, the groove may be formed at least in an outer sublayer on the side of the second auxiliary layer 282 facing the light-emitting element, for example, in the second sublayer 2822 in FIG. 5. The groove may be a groove that does not pass through the second auxiliary layer 282 or the second sub-layer 2822 or may be a groove that passes through the second auxiliary layer 282 or may be a groove that passes through the second sublayer 2822 and extends to other sublayers, such as a groove that extends to the first sublayer 2821 and does not pass through the second auxiliary layer 282.

Optionally, the thinned part 282-b of the second auxiliary layer 282 may include a groove with an opening facing the light-emitting element 300; and the thinned part 282-b of the second auxiliary layer 282 may be formed by etching when the connection part 240 is patterned to form the patterns of the first connection part 241 and the second connection part 242.

Optionally, when the connection part 240 is patterned to form the patterns of the first connection part 241 and the second connection part 242, the region between the first connection part 241 and the second connection part 242 that are electrically connected to a same light-emitting element 300 correspondingly may be over-etched, and the thinned part 282-b of the second auxiliary layer 282 may also be formed.

In some optional embodiments of the present disclosure, the auxiliary film layer may include both the first auxiliary film layer and the second auxiliary layer, and the two layers may cooperate and complement with each other, thereby further improving the reliability of the display panel. Some optional examples may also be illustrated in the present disclosure.

Optionally, referring to FIGS. 3-4, the auxiliary film layer 280 may include the first auxiliary film layer 281 on the side of the first film layer 250 away from the substrate 210.

Through such design, the first auxiliary layer 281 may have a sufficient thickness to perform differentiated design in the region that needs to be hollowed or needs to be changed. Moreover, the reliability of the film layer may be improved, and the fabrication process may be simplified.

The fabrication method of the display panel provided by the present disclosure is described hereinafter.

FIG. 9 illustrates a flowchart of a fabrication method of a display panel according to various embodiments of the present disclosure.

The following describes the fabrication method of the display panel provided by embodiments of the present disclosure with reference to FIGS. 9 to 21.

Figure 10:
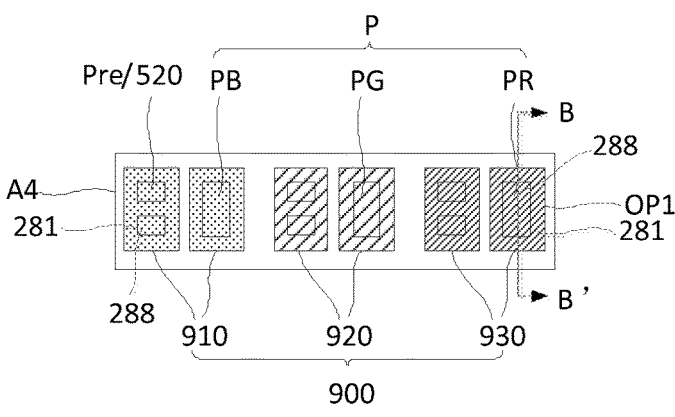
FIG. 10 illustrates a local top view of a drive substrate according to various embodiments of the present disclosure.
Figure 11:
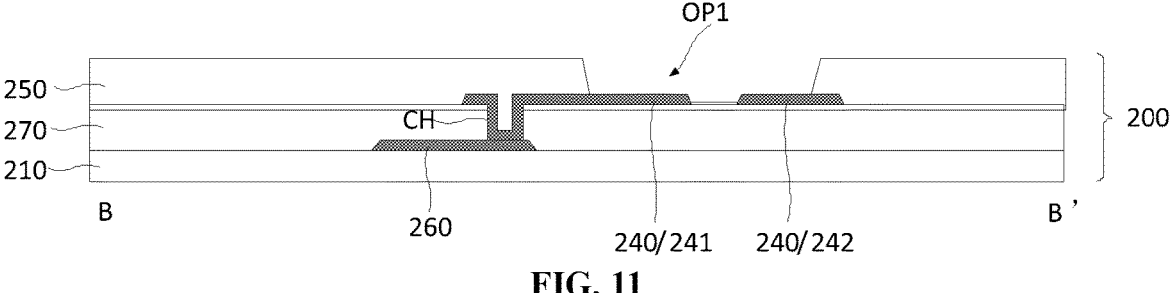
FIG. 11 illustrates a local cross-sectional view along a line BB' in FIG. 10.
Figure 12:
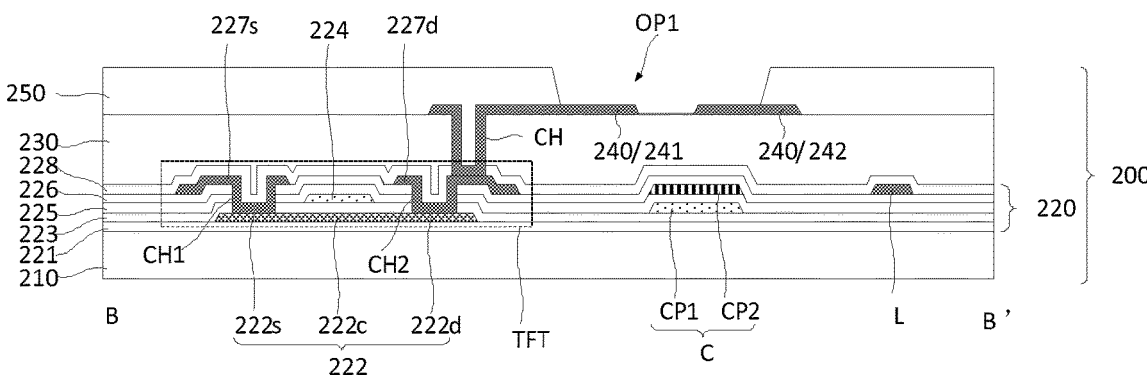
FIG. 12 illustrates another local cross-sectional view along a line BB' in FIG. 10.

FIG. 10 illustrates a local top view of a drive substrate according to various embodiments of the present disclosure. FIG. 11 illustrates a local cross-sectional view along a line BB' in FIG. 10. FIG. 12 illustrates another local cross-sectional view along a line BB' in FIG. 10. FIGS. 11 and 12 respectively illustrate two examples of drive substrates. Subsequent process steps are described using the drive substrate in FIG. 12 as an example. It should be noted that subsequent process steps are also applicable to the drive substrate shown in FIG. 11.

First, in S101, the first film layer 250 of the drive substrate 200 may be formed, and the first opening OP1 may be formed in the first film layer 250.

As shown in FIGS. 11 and 12, the drive substrate 200 may include the substrate 210, a wire layer 260, an insulating layer 270, the connection part 240 and the first film layer 250.

The wire layer 260 may be located on the substrate 210 and may include a plurality of signal lines for transmitting drive signals. FIG. 11 takes the drive substrate 200 including one wire layer 260 as an example. In other embodiments, the circuit layer 250 may include multiple layers to meet the requirements of the number and location of signal lines.

The insulating layer 270 may cover the wire layer 260.

The connection part 240 may be disposed on the insulating layer 270 and electrically connected to the wire layer 260 through the contact hole CH disposed in the insulating layer 270.

The first film layer 250 may be on the upper side of the drive substrate 200. The first opening OP1 may be formed in the first film layer 250. The first opening OP1 may expose the connection part 240 and may be used to receive a part of the electrode layer formed subsequently.

As shown in FIGS. 11 and 12, the drive substrate 200 may include the substrate 21, the drive circuit layer 220, the planarization layer 230 and the first film layer 250. For the drive substrate 200 in FIG. 12, reference may be made to the drive substrate 200 in FIG. 4 and its related description, and same parts may not be described in detail.

The first opening OP1 of the first film layer 250 may be used to receive a part of the electrode layer formed subsequently.

It should be noted that, in order to illustrate the structures closely related to each step more clearly, some reference numerals may be omitted in relevant drawings of subsequent process steps, and reference may be made to other relevant drawings in present disclosure for the omitted reference numerals.

At S102, the auxiliary film layer 280 may be formed. The auxiliary film layer 280 may cover the first film layer 250 and include the hollow part 281-*a* overlapped with the first opening OP1.

Figure 13:
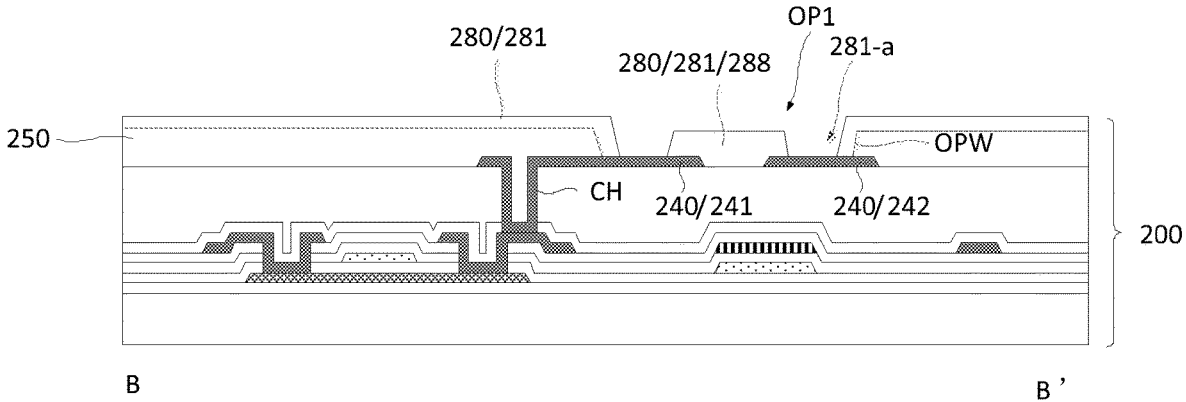
FIG. 13 illustrates a cross-sectional view of a display panel in another fabrication process along a line BB' in FIG. 10.

FIG. 13 illustrates a cross-sectional view of a display panel in another fabrication process along a line BB' in FIG. 10.

Optionally, the auxiliary film layer 280 may be the first auxiliary layer 281. Regarding the auxiliary film layer in one embodiment, in case that there is no conflict, reference may be made to the description of the first auxiliary layer 281 in other embodiments of the present disclosure, which may not be described in detail herein.

Optionally, the first film layer 250 may be provided with the first opening OP1; the auxiliary film layer 280 (i.e., the first auxiliary layer 281) may be provided with the hollow part 281-*a*; and the first opening OP1 and the hollow part 281-*a* may be overlapped with each other.

Optionally, the connection electrode 320 may include a part disposed in the first opening OP1 and the hollow part 281-*a*.

Optionally, the auxiliary film layer 280 may cover the upper surface of the first film layer 250 and the sidewall of the first opening OP1 of the first film layer 250, that is, the auxiliary film layer 280 may surround the exposed surface of the first film layer 250.

Optionally, the part of the connection electrode 320 of the light-emitting element 300 in the first opening OP1 may be in contact with the auxiliary film layer 280.

Figure 14:
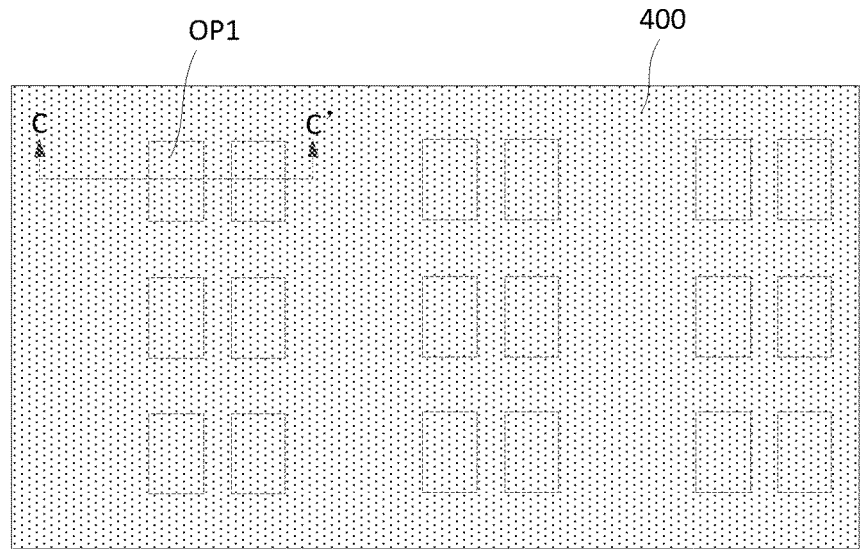
FIG. 14 illustrates a local top view after forming a photoresist layer on a drive substrate.
Figures 15, 16:
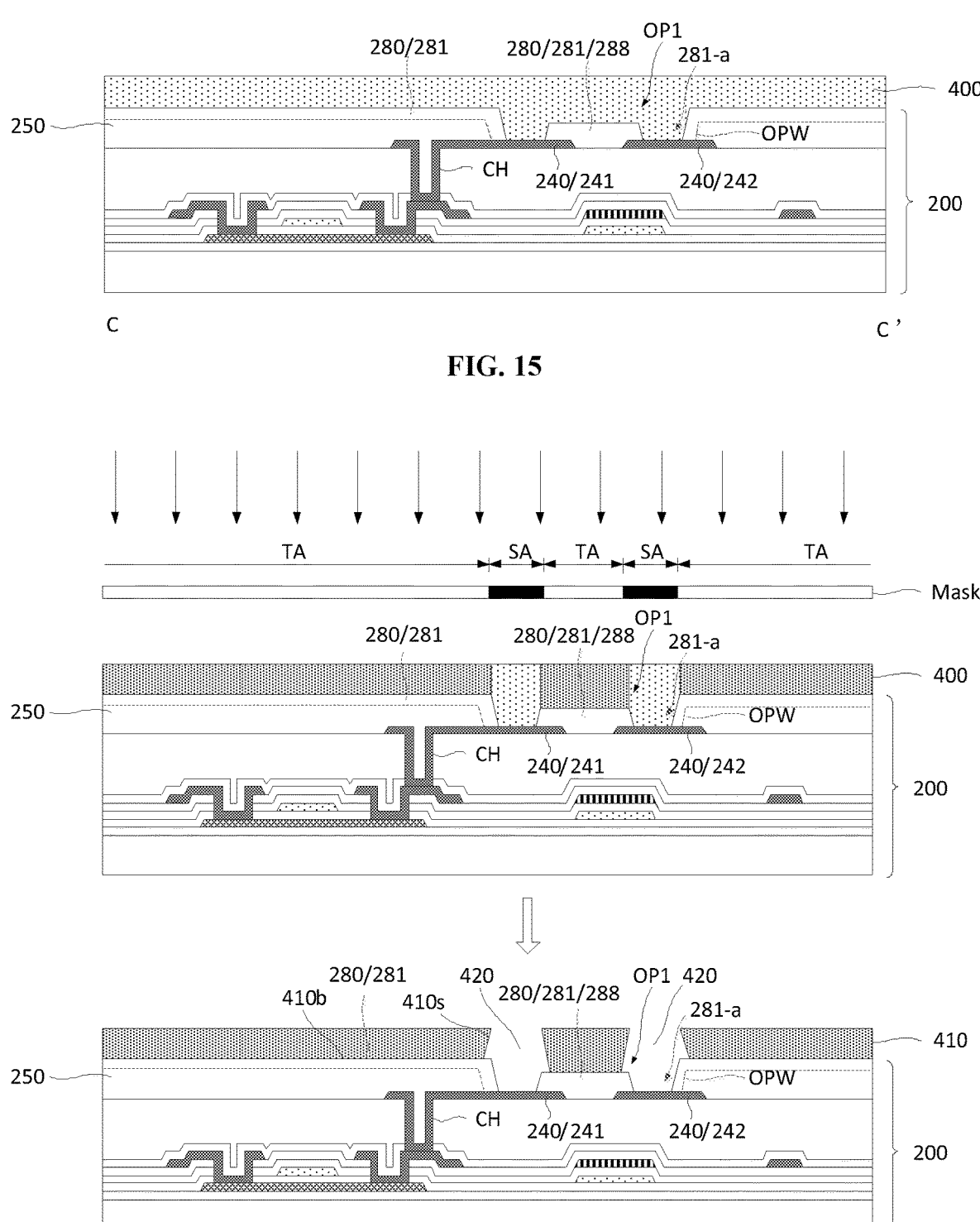
FIG. 15 illustrates a cross-sectional view along a line CC' in FIG. 14.
FIG. 16 illustrates a structural schematic of patterning a photoresist layer to form a photoresist pattern.

FIG. 14 illustrates a local top view after forming a photoresist layer on a drive substrate; and FIG. 15 illustrates a cross-sectional view along a line CC' in FIG. 14.

At S103, a photoresist pattern 410 may be formed. The photoresist pattern 410 may be on the side of the auxiliary film layer 280 away from the first film layer 250 and have a through hole 420 overlapped with the first opening OP1.

Optionally, the photoresist pattern 410 may be formed. The photoresist layer 400 may be on one side of the first film layer 250.

Optionally, the photoresist layer 400 may be provided first. The photoresist layer 400 may be disposed on the upper surface of the drive substrate 200 as an entire layer. For example, the photoresist layer 400 may be disposed on the first film layer 250; and the photoresist layer 400 may be in contact with the first film layer 250 and fill the first opening OP1 of the first film layer 250.

The photoresist pattern 410 may be formed. The photoresist pattern 410 may have the through hole 420 overlapped with the first opening OP1.

FIG. 16 illustrates a structural schematic of patterning a photoresist layer to form a photoresist pattern.

Optionally, the photoresist layer 400 may be patterned by exposure and development to form the photoresist pattern 410.

For example, a mask may be placed above the photoresist layer 400, and light may selectively expose the photoresist layer 400 through the mask, so that the exposed region of the photoresist layer 400 may become a soluble substance; or the exposed region of the photoresist layer 400 may be changed into an insoluble substance, and the soluble substance in the photoresist layer 400 may be removed by developing to form the photoresist pattern 410.

The material of the photoresist layer 400 may be a negative photoresist, the exposed region of the photoresist layer 400 may become insoluble and may be retained in the developing process, while the non-exposed region of the photoresist layer 400 part may be removed.

Figure 17:
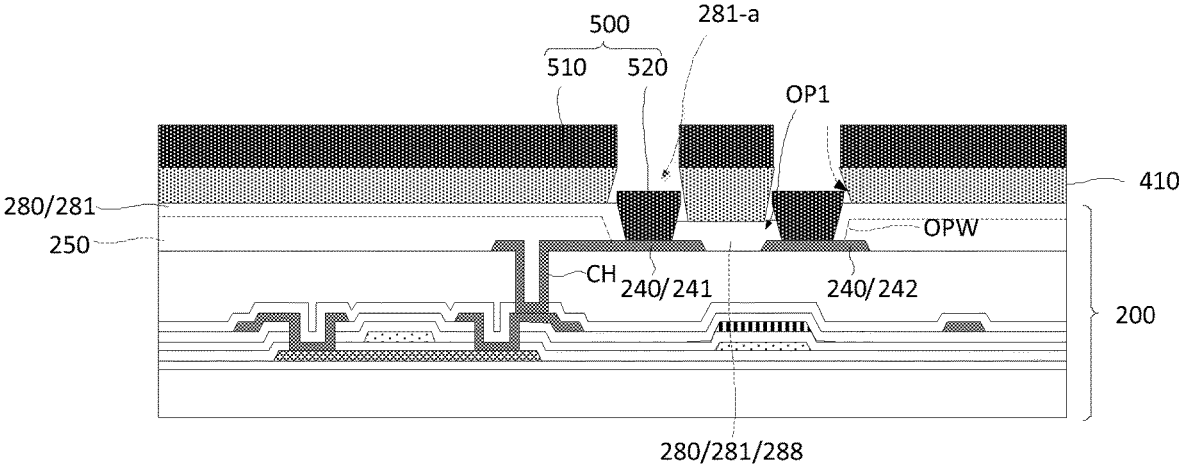
FIG. 17 illustrates a structural schematic after forming an electrode layer.

FIG. 17 illustrates a structural schematic after forming an electrode layer.

At S104, an electrode layer 500 may be formed. The electrode layer 500 may include the first electrode part 510 and the second electrode part 520; the first electrode part 510 may cover the photoresist pattern 410; and the second electrode part 520 may include a part in the first opening OP1 and the hollow part 281-*a*.

The electrode layer 500 may be formed on the photoresist pattern 410 by an evaporation or physical vapor deposition manner. The electrode layer 500 may include the first electrode part 510 and the second electrode part 520. The first electrode part 510 may cover the photoresist pattern 410 (i.e., the remaining part of the photoresist layer 400 during development), and the second electrode part 520 may include a part in the first opening OP1 of the first film layer 250.

Since the photoresist pattern 410 has the through hole 420, and the through hole 420 is overlapped with the first opening OP1 of the first film layer 250, when the electrode layer 500 is formed by a vapor deposition or physical vapor deposition manner, the electrode layer 500 may not only include the part on the photoresist pattern 410, but also include the part in the first opening OP1 of the first film layer 250. In addition, by using a negative photoresist for the photoresist layer 400, a sidewall inclined toward the center of the through hole 420 may be formed at the through hole 420 of the photoresist pattern 410, such that the second electrode part 520 and the first electrode part 510 of the electrode layer 500 may be easily disconnected at the through hole 420.

Figure 18:
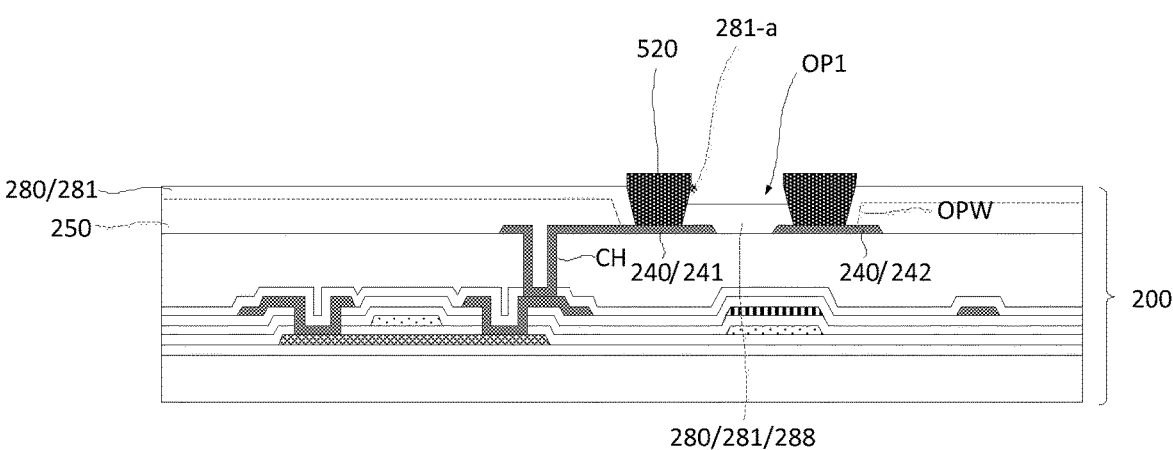
FIG. 18 illustrates a structural schematic after removing a photoresist pattern.

FIG. 18 illustrates a structural schematic after removing a photoresist pattern.

At S105, the photoresist pattern 410 and the first electrode part 510 may be removed.

Optionally, the second electrode part 520 may include a part in the first opening OP1 of the first film layer 250. The thickness of the second electrode part 520 may be greater than the depth of the first opening OP1. That is, the second electrode part 520 may further include a part protruding from the upper surface of the first film layer 250.

Optionally, the second electrode part 520 may include a part in the hollow part 281-*a*. The second electrode part 520 may further include a part protruding from the hollow part 281-*a*, or in other words, the second electrode part 520 may further include a part protruding from the upper surface of the first auxiliary film layer 281.

After removing the photoresist pattern 410 and the first electrode part 510 on the photoresist pattern 410 in the structure shown in FIG. 17, the structure shown in FIG. 18 may be obtained.

The photoresist pattern 410 and the first electrode part 510 may be removed using a removal solution. The sidewall 410 of the photoresist pattern 410 is inclined, so that a gap may be between the sidewall 410 and the second electrode part 520, which may facilitate the inflow of the removal solution (as shown by the dashed arrow in FIG. 17). Therefore, the photoresist pattern 410 and the first electrode part 510 thereon may be removed smoothly.

Figure 19:
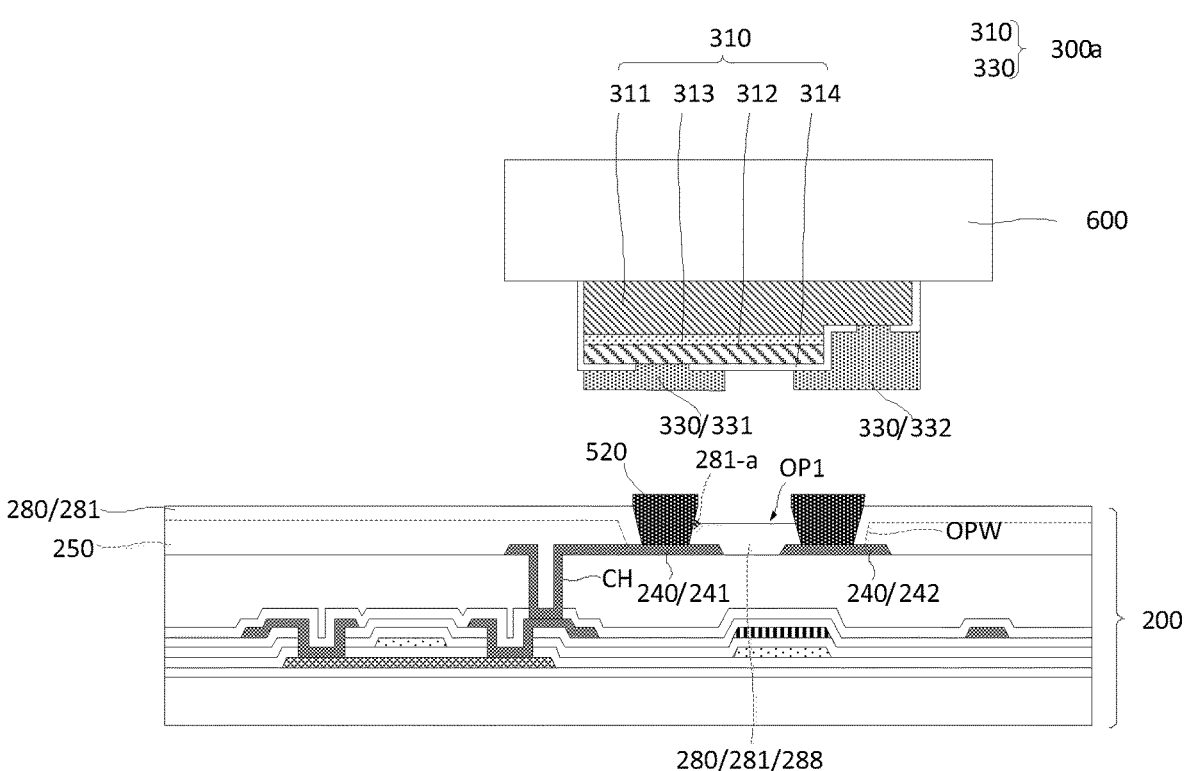
FIG. 19 illustrates a schematic of transporting a light-emitting element.

FIG. 19 illustrates a schematic of transporting a light-emitting element.

At S106, the light-emitting element 300*a* may be provided, and the light-emitting element 300*a* may be transported to the top of the drive substrate 200, where the light-emitting element 300*a* may include a main body part 310 and a bonding electrode 330.

A transport device 600 may transport the light-emitting element 300*a* above the drive substrate 200. The light-emitting element 300*a* may be additionally formed by processes such as epitaxial growth on the source substrate, patterning and the like, and may be placed above the drive substrate 200 by a transport manner.

The light-emitting element 300*a* may include the main body part 310 and the bonding electrode 330. The structure of the main body part 310 may be referred to FIGS. 6-7 and related descriptions, and also be referred to FIG. 19; and same parts may not be described in detail.

The bonding electrode 330 may include the first bonding electrode 331 and the second bonding electrode 332. The first bonding electrode 331 may be electrically connected to the P-type semiconductor layer 312, and the second bonding electrode 332 may be electrically connected to the N-type semiconductor layer 311.

The bonding electrode 330 may include a single-layer metal layer such as gold (Au) and indium (In), or a multi-layer metal layer stacked structure. In one embodiment, the bonding electrode 330 may include an indium (In) film layer.

The transport device 600 may include a transport head, a transport substrate, and the like. In one embodiment, the transport device 600 may be a stamp, and the stamp may pick up a plurality of light-emitting elements 300*a* through van der Waals force and release the light-emitting elements 300 at specific positions to complete the transport of the light-emitting elements 300*a*.

Figure 20:
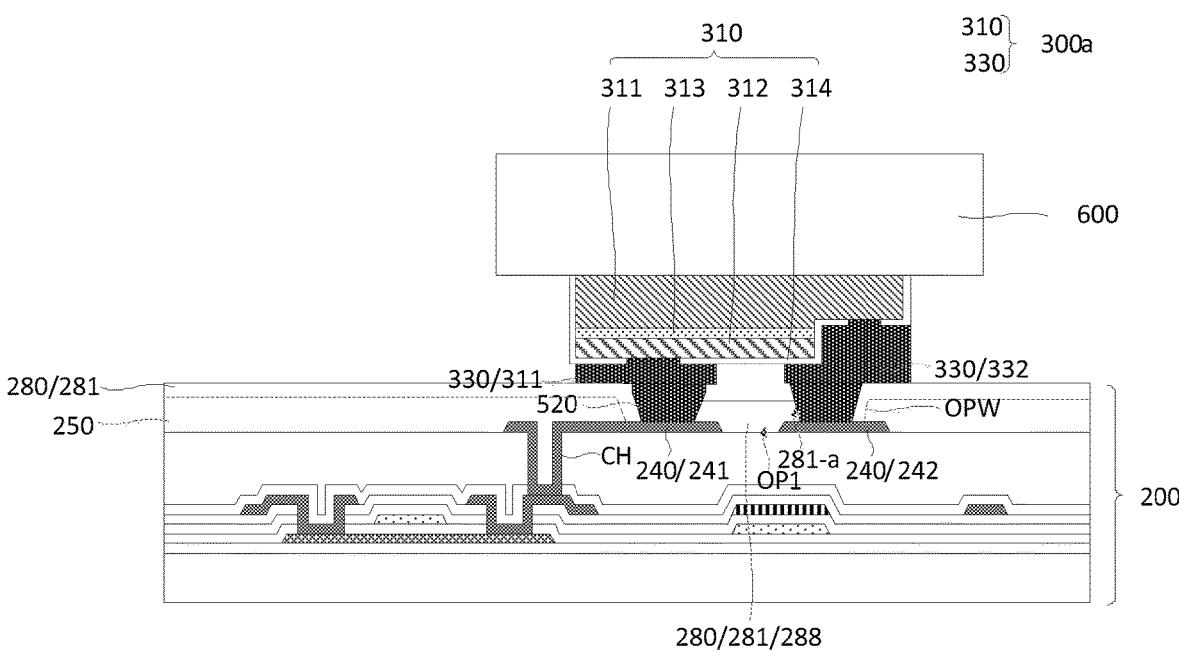
FIG. 20 illustrates a structural schematic of a bonding process of a light-emitting element and a drive substrate.

FIG. 20 illustrates a structural schematic of a bonding process of a light-emitting element and a drive substrate.

At S107, the light-emitting element 300*a* may be bonded with the second electrode part 520, so that the bonding electrode 330 and the second electrode part 520 may form the connection electrode 320 of the light-emitting element 300.

The bonding electrode 330 of the light-emitting element 300*a* may be in contact with the second electrode part 520 on the drive substrate 200, and a eutectic reaction may occur at a certain temperature. The bonding electrode 330 and the second electrode part 520 may be crystallized into a crystal mixture (eutectic), that is, the connection electrode 320 (the first electrode 321 and the second electrode 322) of the light-emitting element 300 in FIG. 20 may be formed. In one embodiment, the second electrode part 520 may include gold (Au), the bonding electrode 330 may include indium (In), and the connection electrode 320 of the light-emitting element 300 formed by the eutectic reaction between the second electrode part 520 and the bonding electrode 330 may be a gold indium alloy.

During the bonding process, the second electrode part 520 may be melted and pressed, which may easily cause flow. By disposing the second electrode part 520 in the first opening OP1, the range of its flow to the surroundings may be reduced, so that the first electrode 321 and the second electrode 322 which are formed may be not in contact with each other to be short-circuited.

Figure 21:
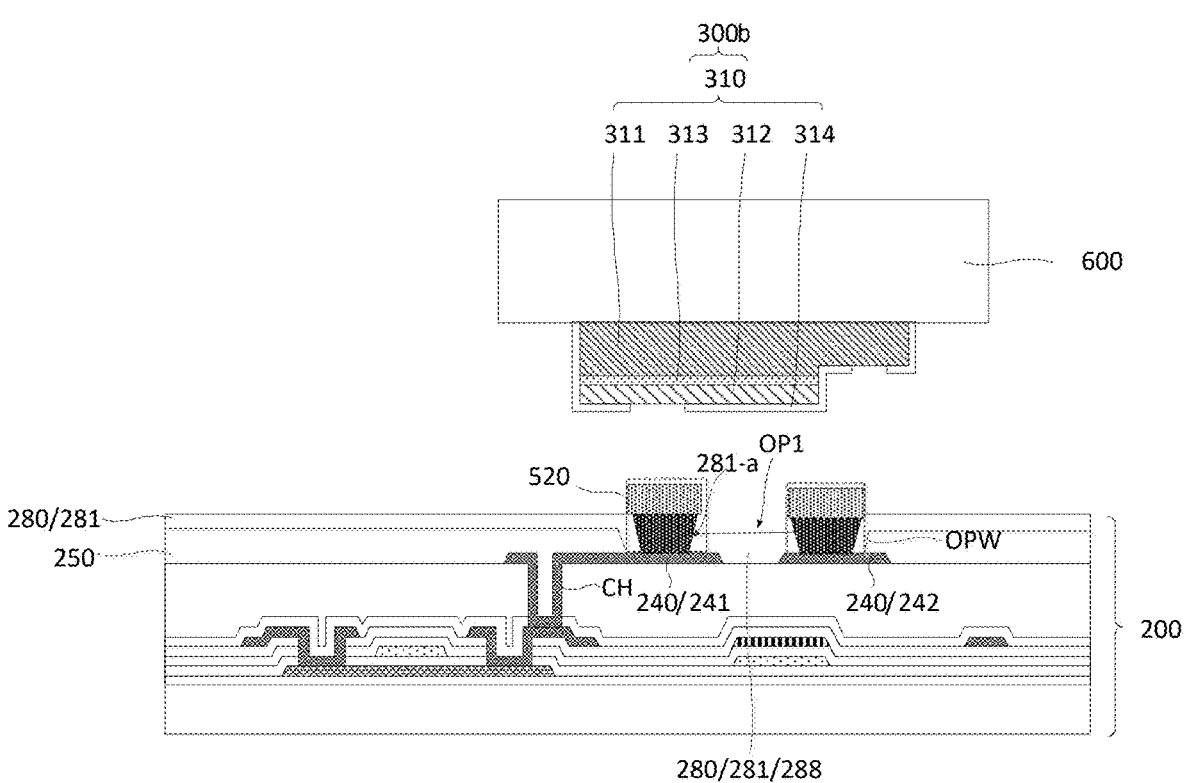
FIG. 21 illustrates another schematic of transporting a light-emitting element.

Another embodiment of the fabrication method of the display panel provided by embodiments of the present disclosure is described with reference to FIGS. 9 and 21. FIG. 21 illustrates another schematic of transporting a light-emitting element.

S101-S103 and S105 may be same as described above, and the processes of S104, S106 and S107 are described as follows.

At S104, the electrode layer 500 may be formed. The electrode layer 500 may include the first electrode part 510 and the second electrode part 520; the first electrode part 510 may cover the photoresist pattern 410; and the second electrode part 520 may include a part in the first opening OP1.

In S104, the electrode layer 500 may include the first metal and the second metal which are stacked with each other. For example, the first metal may be gold (Au), and the second metal may be indium (In).

At S106, the light-emitting element 300*b* may be provided. The light-emitting element 300*b* may be transported to the top of the drive substrate 200, where the light-emitting element 300*b* may include the main body part 310.

At S107, the light-emitting element 300*b* may be bonded with the second electrode part 520, so that the second electrode part 520 may form the connection electrode 320 of the light-emitting element 300.

In S107, the first metal and the second metal, which are stacked with each other, in the second electrode part 520 may undergo eutectic reaction to form a gold-indium alloy, which may be used as the connection electrode 320 of the light-emitting element 300. Meanwhile, during the bonding process, the main body part 310 of the light-emitting element 300*b* may also be in contact with the second electrode part 520 and form a fixed electrical connection.

The inventors had found that during the process of removing the photoresist pattern 410 and the first electrode part 510 by using the removal solution, the removal solution may also flow into the gap between the sidewall of the photoresist pattern 410 and the second electrode part 520.

If the structure of the first auxiliary layer 281 is not provided, the first film layer 250 may be exposed at the gap, and the removal solution may be in contact with the first film layer 250 at the gap, which may result in that the black photoresist including the first film layer 250 is discolored to be failed.

The first auxiliary layer 281 may be provided. The first auxiliary layer 281 may cover the exposed surface of the first film layer 250 to isolate the first film layer 250 from the removal solution. In such way, when removing the photoresist pattern 410, the removal solution may be prevented from contacting with the first film layer 250 and being corroded by the removal solution, thereby preventing the first film layer 250 from discoloration and failure.

Optionally, the first auxiliary layer 281 may be made of a material that is resistant to the influence of the removal solution.

Optionally, the density of the first auxiliary layer 281 may be higher than the density of the first film layer. For example, the first auxiliary layer 281 may be made of a molecular-level film material. Through such design, the ability of the first auxiliary layer 281 to protect the first film layer against the influence of the removal solution may be improved.

Optionally, the first auxiliary layer 281 may be overlapped with at least a part of the sidewalls of the first opening OP1.

It may be understood that the "overlapped" direction mentioned in one embodiment is a direction perpendicular to the plane where the sidewall of the first opening OP1 is located. Optionally, the auxiliary film layer 280 may cover the upper surface of the first film layer 250 and the sidewall of the first opening OP1 of the first film layer 250, that is, the auxiliary film layer 280 may surround the exposed surface of the first film layer 250. That is, the first auxiliary layer 281 may cover the sidewall of the first opening OP1. In one embodiment, the effect of the first auxiliary layer 281 in preventing the removal solution from invading the first film layer 250 may be further improved.

Optionally, as shown in FIG. 10, the first auxiliary layer 281 may include the hollow part 281-*a*; and the hollow part 281-*a* may be within the coverage range of the first opening OP1. Optionally, the part of the connection electrode 320 of the light-emitting element 300 in the first opening OP1 may be in contact with the auxiliary film layer 280. That is, the first auxiliary layer 281 may be in contact with the film layer on the side of the exposed first film layer 250, exposed by the first opening OP1, away from the first auxiliary layer 281, such that the first film layer 250 may be encapsulated by the film layers on adjacent two sides of the first film layer 250 at the first opening OP1. In such way, the effect of the first auxiliary layer 281 in preventing the removal solution from invading the first film layer 250 may be further improved.

Optionally, in some embodiments, the first auxiliary layer may be a positive photoresist.

Optionally, the first auxiliary layer 281 may include an organic material.

On one hand, optionally, the first auxiliary layer 281 may include an organic material such as acrylic, polyimide (PI) or benzocyclobutene (BCB); the first auxiliary layer 281 may have a planarization function, which may continue to provide a flat surface on the first film layer to facilitate subsequent processes. For example, in some embodiments, the eutectic process between the second electrode part and the bonding electrode may be facilitated to proceed smoothly, and the reliability of electrode bonding may be improved.

Figure 22:
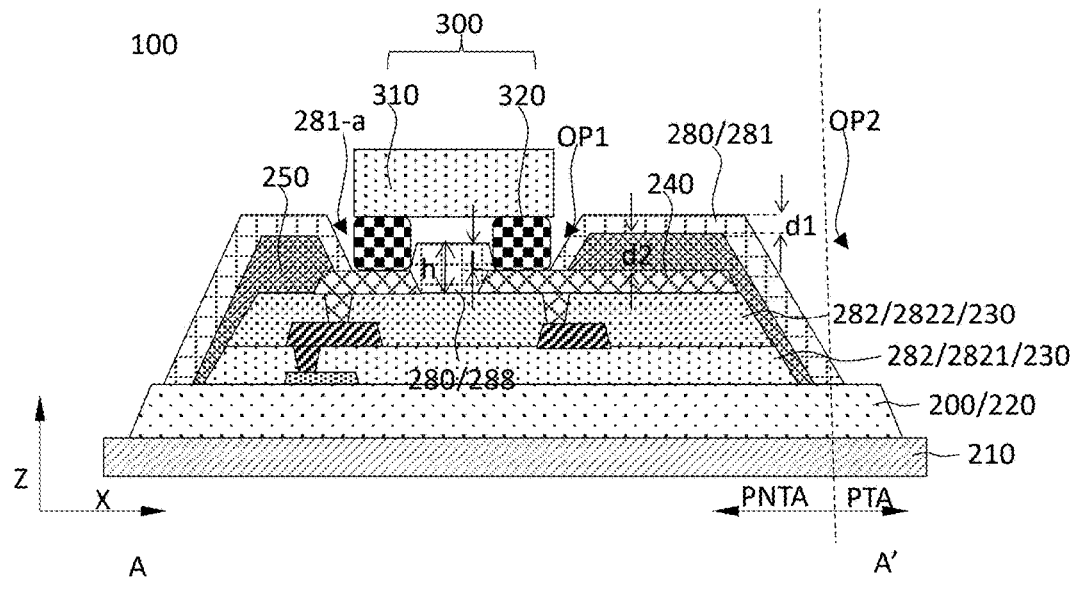
FIGS. 22-25 respectively illustrate other cross-sectional views along a line AA' in FIG. 2.

On the other hand, as shown in FIG. 22, FIG. 22 illustrates another cross-sectional view along a line AA' in FIG. 2; and the cross-section is perpendicular to the plane where the display panel is located.

Optionally, the display panel may further include an encapsulation layer 700. The encapsulation layer 700 may be used to encapsulate the light-emitting element 300. The encapsulation layer 700 may include an encapsulation adhesive 710. The encapsulation adhesive 710 may cover the drive substrate 200 and the light-emitting element 300.

The inventors had further found that, in one embodiment that the first film layer 250 includes a light-absorbing material, the first film layer 250 may reduce the reflectivity of the display panel. After the first auxiliary layer 281 is added, the interface between the first auxiliary layer 281 and the encapsulation adhesive 710 may be newly added in the display panel. The newly added interface may easily cause the problem of increased reflectivity, which may hinder the realization of the purpose of reducing the reflectivity of the display panel by using the first film layer 250.

Based on above, a silicon oxide layer may be included in the first auxiliary layer 281. The refractive index of the silicon oxide layer may be similar to the refractive index of the material of the encapsulation layer 700. For example, the refractive index of the silicon oxide layer may be similar to the refractive index of the encapsulation adhesive 710, which may reduce the interface reflection between the first auxiliary layer 281 and the encapsulation adhesive 710 and reduce reflectivity increase problem caused by large refractive index difference.

That is, after trying to use inorganic materials to fabricate the first auxiliary layer, it had been found that in order to ensure the light extraction effect, if the first auxiliary layer is made of an inorganic material, $SiO_2$ which has a refractive index similar to the refractive index of glass may need to be used.

However, the inventors had further found that the bonding ability of $SiO_2$ and the first film layer formed by an organic material may be poor, that is, if a silicon oxide layer is directly deposited on the first film layer 250, the silicon oxide layer may be easily cracked and peeled off. It is necessary to add a silicon nitride layer between the silicon oxide layer and the first film layer 250, and the silicon nitride layer may play a transition role between the silicon oxide layer and the first film layer 250, which may improve film layer bonding ability between the silicon oxide layer of the first auxiliary layer 281 and the first film layer 250 and prevent film layer separation.

Therefore, the first auxiliary layer formed by the inorganic layer may need two sub-layers, which may increase fabrication cost.

In addition, the inorganic layer may need to be formed by a CVD (chemical vapor deposition) manner, and then dry-etched to form a desired pattern, for example, form above-mentioned hollow part. Therefore, the first auxiliary layer formed by the silicon oxide layer and the silicon nitride layer may need at least two CVD film formations. However, in embodiments of the present disclosure, the first auxiliary layer formed by an organic material may only need photolithography to form a patterned film layer, which may simplify technological process and reduce cost.

In addition, the silicon oxide layer and the silicon nitride layer may be limited by material process, which may cause cavity pollution when the film pattern is formed. Through the present disclosure, the cavity pollution caused by above film patterning may be avoided, which may greatly improve production yield.

On the other hand, optionally, the auxiliary film layer and the photoresist pattern may be formed by using a same mask because the first auxiliary layer formed by an organic material may only need photolithography to form a patterned film layer. The mask of the photoresist layer for subsequent patterning of related film layers may be reused; that is, the mask with a same light-blocking region pattern (such as a same mask) may be used to save the cost of mask production. For example, the first auxiliary layer and the photoresist pattern 410 may be formed using a same mask.

In addition, optionally, the display panel may include the second auxiliary layer 282 provided in present disclosure; and the second auxiliary layer 282 may be a film layer formed by an organic material. The first auxiliary layer 281 may be in contact with the second auxiliary layer 281 on the side of the first film layer 250, exposed by the first opening OP1, away from the first auxiliary layer 281, such that the first film layer 250 may be encapsulated by the organic film layers on adjacent two sides of the first film layer 250 at the first opening OP1. In addition, the first auxiliary layer 281 and the second auxiliary layer 281 formed by the organic film layer may have better bonding performance, which may further improve the effect of blocking the removal solution from invading the first film layer 250.

Optionally, in some embodiments, the first auxiliary layer may be a positive photoresist.

Optionally, the thickness of the first film layer 250 is d2 and the thickness of the first auxiliary layer 281 is d1; and the sum of the thickness d2 of the first film layer 250 and the thickness d1 of the first auxiliary layer 281 is H, that is, $H=d1+d2$.

It should be noted that d1 refers to the thickness of the part of the first auxiliary layer 281 covering the first auxiliary layer 281; and the thickness direction is the third direction Z.

Optionally, the sum of the thickness of the first film layer 250 and the thickness of the first auxiliary layer 281 may satisfy $H \leq 4$ µm.

In such way, the opening formed by the first opening and the hollow part may be avoided from being excessively deep, and the light-emitting element may be avoided from not being electrically connected to the electrode 240 (i.e., the connection part 240) on the drive substrate.

Optionally, the drive substrate may include a plurality of electrodes exposed by the first opening; and the plurality of electrodes may respectively correspond to different hollow parts.

For example, the electrode 240 may be the connection part 240 described above (the electrode and the connection part share a same label 240 in present disclosure). The connection part 240 may include the first connection part 241 and the second connection part 242. The first connection part 241 and the second connection part 242 may form the plurality of electrodes. The first connection part 241 and the second connection part 242 may correspond to different hollow parts 281-a respectively.

Optionally, a same first opening OP1 may correspond to multiple hollow parts 281-a.

Optionally, the electrodes exposed by a same first opening OP1 may correspond to different hollow parts 281-a respectively. That is, the first connection part 241 and the second connection part 242 corresponding to a same light-emitting element 300 may correspond to different hollow parts 281-a respectively.

Optionally, one hollow part 281-a may expose one electrode 240.

Optionally, the second electrode part 520 may include a part in the hollow part 281-a of the first auxiliary layer 281.

Optionally, the second electrode part 520 may further include a part protruding from the hollow part 281-a; or in other words, the second electrode part 520 may further include a part protruding from the upper surface of the first auxiliary film layer 281.

Through one embodiment, on one hand, the exposed electrode and the second electrode part 520 may be defined by the hollow part formed by the auxiliary film layer 280. On the other hand, optionally, the first film layer 250 includes a light-absorbing material. The first film layer 250 may be used for blocking light and play a role in reducing the reflectivity of the display panel by absorbing external ambient light. Optionally, the first film layer 250 may be doped with black nanoparticles.

Optionally, the first auxiliary layer 281 may be a light-transmitting material.

Optionally, the resolution of the first auxiliary layer 281 may be higher than the resolution of the first film layer 250, so that patterning accuracy of the first auxiliary layer may be improved.

Since the first film layer is a light-absorbing material or a light-blocking material, it is normally doped with black nanoparticles. Therefore, its patterning precision may be low, and it is difficult to precisely define the openings having a one-to-one correspondence with the electrodes. In one embodiment, the first auxiliary layer 281 may be patterned to form a more precise opening pattern, which may improve the alignment reliability between the light-emitting element and the drive substrate. That is, the first auxiliary layer 281 may remain around the electrode to form a groove, and the eutectic layer may sink to the organic film formed by the first auxiliary layer 281, which may reduce falling off problem of the light-emitting element.

Optionally, the density of the first auxiliary layer 281 may be higher than the density of the first film layer 250.

Optionally, the density of the first auxiliary layer 281 may be higher than the density of the second auxiliary layer 282.

Figure 23:
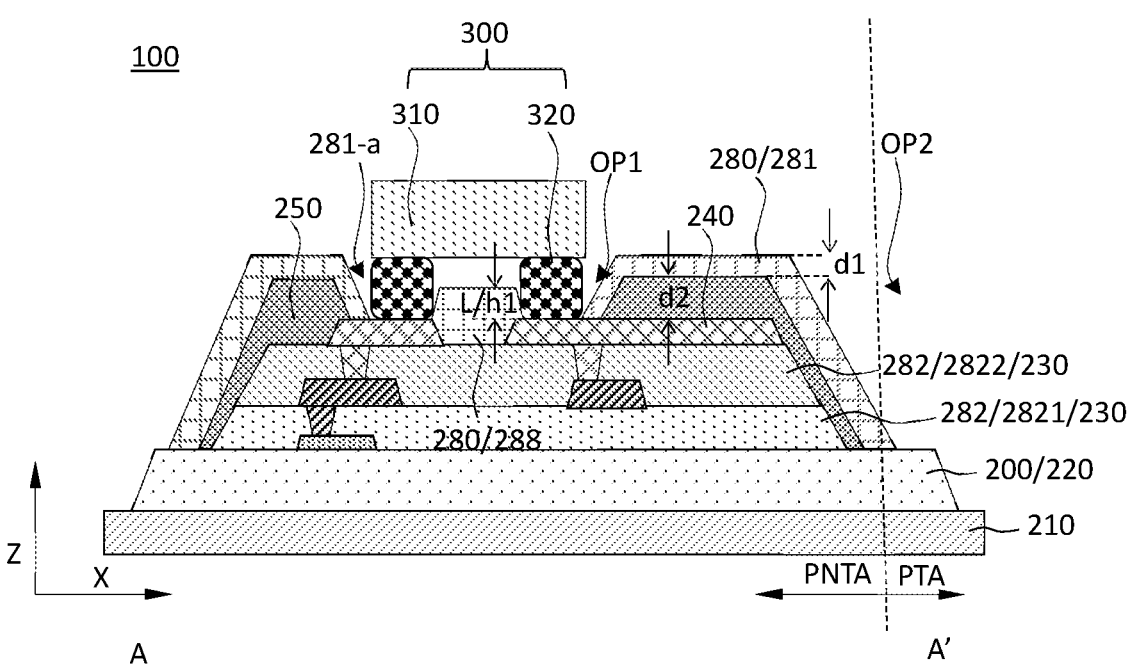

As shown in FIGS. 6-7 or FIGS. 22-33, the accompanying drawings related to the method are combined. FIGS. 22-23 illustrate other cross-sectional views along a line AA' in FIG. 2 respectively. The cross-section is perpendicular to the plane where the display panel is located.

Optionally, the drive substrate 200 may include a plurality of electrodes 240 exposed by the first openings OP1; and the first auxiliary layer 281 may include separation elements 288 between the electrodes 240.

In one embodiment, the short circuit problem caused by the metal of the eutectic layer flowing to the surroundings under a high temperature external pressure state may be avoided.

For example, the electrode 240 may be the connection part 240 described above.

Optionally, one first opening OP1 may expose a plurality of electrodes 240, that is, at least two electrodes 240 may be exposed by a same first opening OP1. The "expose" mentioned here may be understood as the orthographic projection of at least two electrodes 240 on the substrate may be overlapped with the orthographic projection of a same first opening OP1 on the substrate.

Optionally, at least two electrodes 240 exposed by a same first opening OP1 may be electrically connected to a same light-emitting element 300.

Optionally, the connection part 240 may include the first connection part 241 and the second connection part 242. The first connection part 241 and the second connection part 242 may form the plurality of electrodes 240. The first connection part 241 and the second connection part 242 corresponding to a same light-emitting element 300 may correspond to different hollow parts 281-a respectively.

As shown in FIGS. 22-23, the distance from the top surface of the separation element 288 to the electrode is L, where $L \leq 4$ µm. According to one embodiment, during the photolithography of the first auxiliary layer 281, the first auxiliary layer 281 may be remained between the electrodes 240 corresponding to the light-emitting element 300, and only the electrode 240 may be exposed. After the photolithography of the first auxiliary layer 281, the height between the upper surface of the first auxiliary layer 281 between the electrodes 240 and the upper surface of the electrode 240 may satisfy $L \leq 2$ µm. At this point, it may avoid that the separation element may be in contact with the light-emitting element when the light-emitting element and the drive substrate are aligned and bonded, thereby ensuring that the separation element may not affect the bonding of the light-emitting element when the separation element is used to prevent short-circuit.

Optionally, L≤2 μm, the compatibility of light-emitting elements of various sizes may be fully ensured.

It should be noted that the "top surface" mentioned in present disclosure refers to the surface of the side of the structure facing the light-emitting surface of the display panel 100. For example, the electrode separation element 288 includes two opposite surfaces along the third direction Z, two surfaces may be the bottom surface facing the substrate 210 and the top surface facing the light-emitting element 300, respectively. The top surface of the electrode 240 may be similar to above description, which may not be described in detail herein.

As shown in FIGS. 22-23, optionally, the thickness h of the separation element may be greater than the thickness d1 of the first auxiliary layer 281 in the upper region of the first film layer. In such way, the separation element may suffi-ciently block the overflow of the eutectic layer.

Optionally, a part of the first auxiliary layer 281 on the first film layer 250 and the separation element 288 may be made of a same material and a same process.

Optionally, a part of the first auxiliary layer 281 on the first film layer 250 may be continuous with the separation element 288.

The inventors had found that the position of the part of the first auxiliary layer 281 on the first film layer 250 may be higher than the position of the part of the first auxiliary layer 281 in the first opening OP1, the first auxiliary layer 281 may be fluid since it is an organic material, and a same material may have a high material thickness at low position. Therefore, the separation element with a higher thickness may be fabricated through a same process. It may be understood that the high position mentioned here may also be farther from the substrate along the third direction Z.

As shown in FIGS. 22-23, optionally, the sum of the thicknesses of the first film layer and the first auxiliary layer is H, and the thickness of the separation element is h, where h≤½*H.

That is, the top of the separation element 288 of the first auxiliary layer 281 may be lower than the top of the non-separation element region of the first auxiliary layer 281. In some embodiments, as shown in FIG. 22, the separation element thickness h refers to the distance h1 from the bottom surface to the top surface of the separation element 288 along the third direction Z. In some embodi-ments, as shown in FIG. 23, the separation element thickness h refers to the distance h2 from the top surface of the separation element 288 to the top surface of the electrode.

In one embodiment, the separation element may be pre-vented from pushing up the light-emitting element when the separation element can sufficiently block the flow of the eutectic layer; and the separation element may be avoided to be in contact with the light-emitting element when the light-emitting element and the drive substrate are aligned and bonded, which may ensure that the separation element may not affect the bonding of the light-emitting element when the separation element is used to prevent short-circuit.

Optionally, the thickness of the first film layer 250 is d2, and the thickness of the first auxiliary layer 281 is d1; and the sum of the thickness d2 of the first film layer 250 and the thickness h1 of the first auxiliary layer 281 is H, and H=d1+d2. It should be noted that d1 refers to the thickness of the part of the first auxiliary layer 281 covering the first auxiliary layer 281, that is, the non-separation element region of the first auxiliary layer 281, where the thickness direction is the third direction Z.

Optionally, the sum H of the thickness of the first film layer 250 and the thickness of the first auxiliary layer 281 may satisfy H≤4 μm.

In one embodiment, the opening formed by the first opening and the hollow part may be prevented from being excessively deep, so that the light-emitting element cannot be electrically connected to the electrode 240 (i.e., the connection part 240) on the drive substrate.

Figure 24:
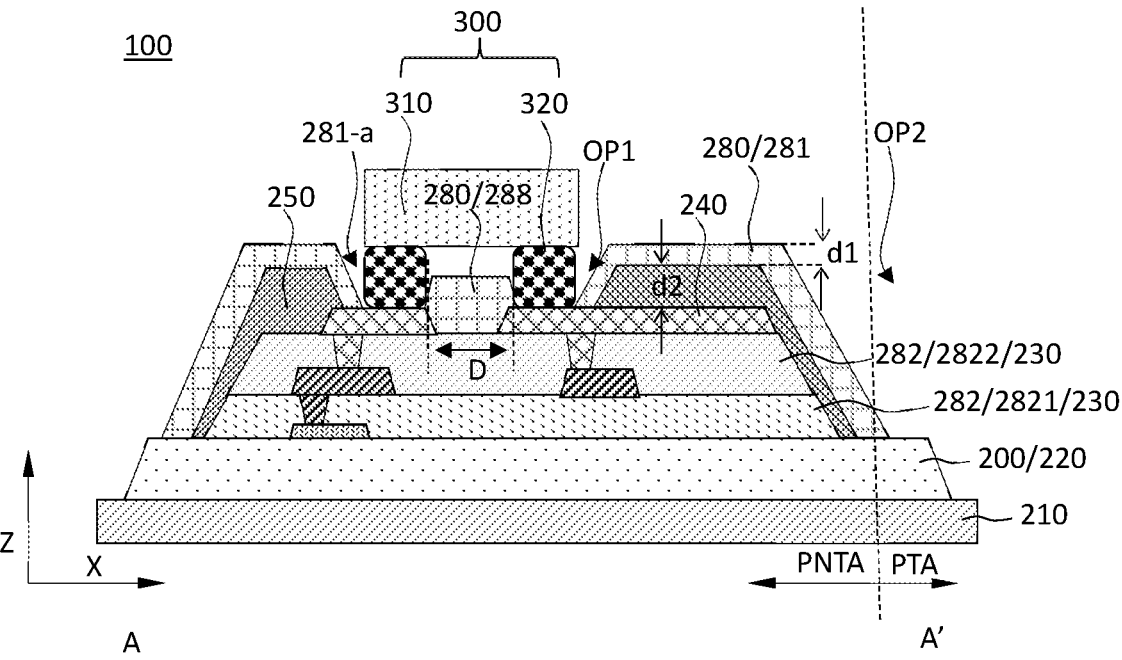

FIG. 24 illustrates another cross-sectional view along a line AA' in FIG. 2. The cross section is perpendicular to the plane where the display panel is located.

Optionally, the width of the separation element is D, where D≤5 μm. The direction of the width is the direction pointing from the electrode adjacent to one side of the separation element to the electrode adjacent to the other side of the separation element, that is, the direction in parallel with the connection direction of the electrodes 240 on two adjacent sides of the separation element 288.

Optionally, the distance between the electrodes 240 cor-responding to a same light-emitting element 300 may be 3-4 μm apart.

Optionally, the width of the separation element may be greater than the distance between the electrodes 240 corre-sponding to a same light-emitting element 300.

According to embodiments of the present disclosure, the size of the separation element may need to be matched with the electrode configuration. Considering the aspects of increasing the pixel density or reducing the space occupied by the electrodes, the distance between the electrodes may normally not be excessively large, which may require the accuracy of the separation element to meet requirements. However, for above-mentioned first film layer that needs to improve the display effect, it may not satisfy requirements that the material can meet requirements of improving the display effect and also have a high resolution. Therefore, in embodiments of the present disclosure, above-mentioned first auxiliary layer may be used to form the separation element that meets the requirements. Meanwhile, the first auxiliary layer may not only have other functions mentioned above, but also meet required design precision size. In one embodiment, it also provides a size design of the first auxiliary layer that may meet fabrication condition con-straints of the first auxiliary layer and also match electrode sizes. Therefore, the reliability of the display panel may be improved without increasing process difficulty.

Figure 25:
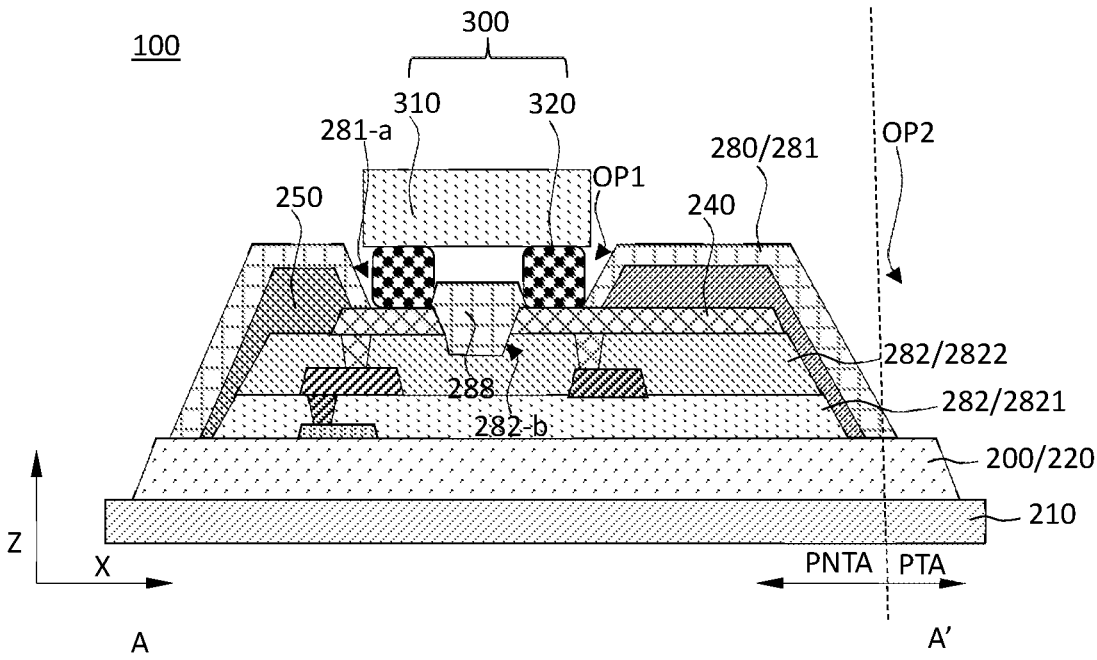

FIG. 25 illustrates another cross-sectional view along a line AA' in FIG. 2. The cross section is perpendicular to the plane where the display panel is located.

The second auxiliary layer 282 may include the thinned part 282-b; and the separation element 288 may be over-lapped with the thinned part 282-b. The thinned part 282-b may refer to relevant introductions of above-mentioned embodiments.

Optionally, the first auxiliary layer 281 and the second auxiliary layer 282 may be in contact with each other in the first opening OP1, which may refer to description of above-mentioned embodiments regarding the encapsulation of the first film layer 250 by above two layers.

Optionally, the separation element 288 may be at least partially filled in the groove formed by the thinned part 282-b.

Optionally, the top surface of the separation element 288 may extend beyond the groove formed by the thinned part 282-b and may be sandwiched between the connection electrodes of two light-emitting elements.

In one embodiment, the first auxiliary layer 281 and the second auxiliary layer 282 may be used to cooperate with each other, which may avoid that the height of the separation element 288 may be too high to push up the light-emitting element.

Optionally, the first auxiliary layer 281 may form the separation element 288; the first auxiliary layer 281 may be an organic film layer; and the first auxiliary layer 281 formed by the organic film layer and the separation element 288 may satisfy some advantages in above-mentioned embodiments. However, in one embodiment, the risk of pushing up the light-emitting element due to the fact that the thickness of the organic film layer itself is normally larger than the thickness of the inorganic layer may be avoided. In addition, the thinned part 282-*b* may guide the organic material having fluidity during the fabrication process to form the separation element 288 more easily to the position needed.

Optionally, the formation of the thinned part 282-*b* may refer to above description, so that the height of the separation element 288 may be controllable without adding an additional process. Therefore, the first auxiliary layer 281 may be fabricated without being too concerned about height limit, so that the first auxiliary layer 281 may have a certain height to meet other design requirements.

Figure 26:
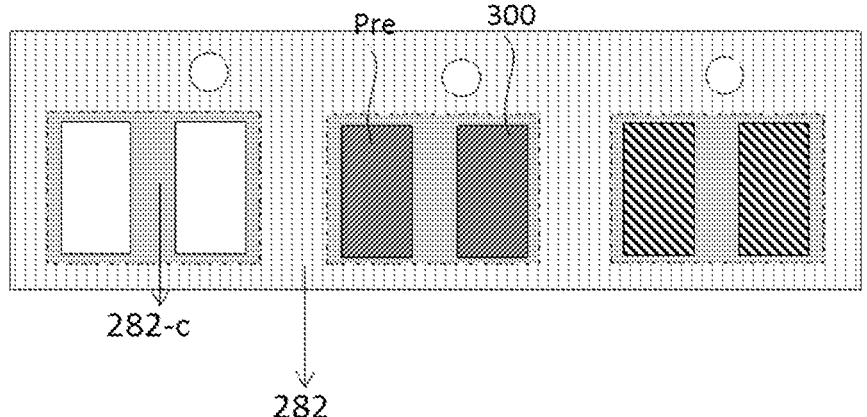
FIG. 26 illustrates a local top view of a drive substrate according to various embodiments of the present disclosure.

FIG. 26 illustrates a local top view of a drive substrate according to various embodiments of the present disclosure. FIG. 27 illustrates a cross-sectional view of a display panel according to various embodiments of the present disclosure. The cross section is perpendicular to the plane where the display panel is located.

The second auxiliary layer 282 may include a thickened part 282-*c*; and the thickened part 282-*c* may be in the first opening OP1.

Optionally, the projection of the thickened part 282-*c* along the direction perpendicular to the plane where the display panel is located, that is, the third direction Z, may be in the first opening OP1.

Optionally, the protrusion formed by the thickened part 282-*c* may protrude toward the inside of the first opening OP1 to form the effect of being accommodated by the first opening OP1. Therefore, the first opening may be overlapped with the thickened part 282-*c* along the direction parallel to the plane of the display panel.

Optionally, the drive substrate 200 may include a plurality of electrodes 240 exposed by the first opening OP1; and at least a part of the electrodes 240 may be on the thickened part 282-*c*.

In one embodiment, the second auxiliary layer at the bottom of the light-emitting element may be raised, and the electrode may also be raised after the electrode is deposited above the second auxiliary layer. Since the electrode is raised, there is no need to be concerned that the organic first film layer or the first auxiliary layer is too high to cause the light-emitting element to be unable to be aligned, and there is no need to limit the height of the first film layer (because the first film layer may need to meet some above-mentioned other requirements, such as the light-blocking film layer may need to be configured to meet a certain thickness). Therefore, in one embodiment, it may be beneficial for improving the bonding yield of the light-emitting elements.

Optionally, the second auxiliary layer 282 may include the thickened part 282-*c*. The thickened parts 282-*c* may be in one-to-one correspondence with at least a part of the light-emitting elements 300.

That is, the electrode corresponding to one light-emitting element (optionally, may include the electrode (i.e., a redundant electrode Pre) of a backup light-emitting element in a redundant configuration region corresponding to the light-emitting element) may be raised by one thickened part 282-*c*.

Figure 28:
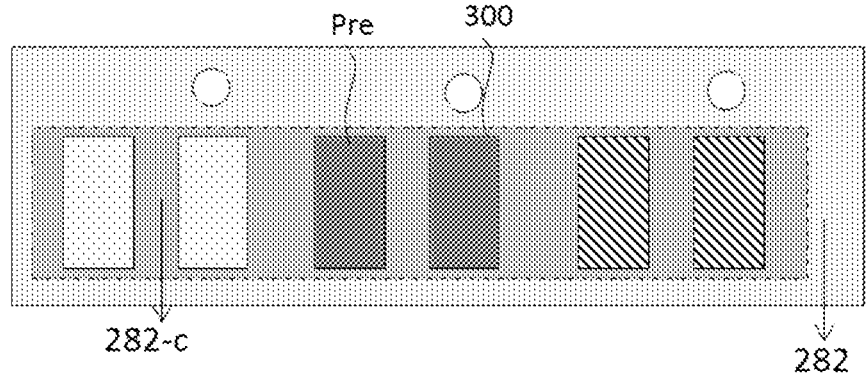
FIG. 28 illustrates a local top view of a drive substrate according to various embodiments of the present disclosure.

FIG. 28 illustrates a local top view of a drive substrate according to various embodiments of the present disclosure.

Optionally, the second auxiliary layer 282 may include thickened parts 282-*c*. At least a part of the thickened parts 282-*c* corresponding to different light-emitting elements 300 may be continuous. That is, one thickened part 282-*c* may simultaneously raise the electrodes 240 of the plurality of light-emitting elements 300.

Optionally, one pixel SP may correspond to one thickening part 282-*c*. That is, the electrode 240 of the light-emitting element 300 in a same pixel SP may be overlapped with a same thickened part 282-*c* along the third direction Z, and may be in contact with the thickened part 282-*c* and raised by the thickened part 282-*c*. The introduction of the pixel SP may refer to following or other embodiments of the present disclosure.

Optionally, some optional embodiments of the present disclosure may refer to the drawings related to the light-transmitting region and the non-light-transmitting region of the display panel provided in the present disclosure.

The display panel may include the light-transmitting region and the non-light-transmitting region; the non-light-transmitting region may include a light-emitting element configuration region; the first film layer may further include a second opening; and the second opening may define a pixel light-transmitting region.

Figure 29:
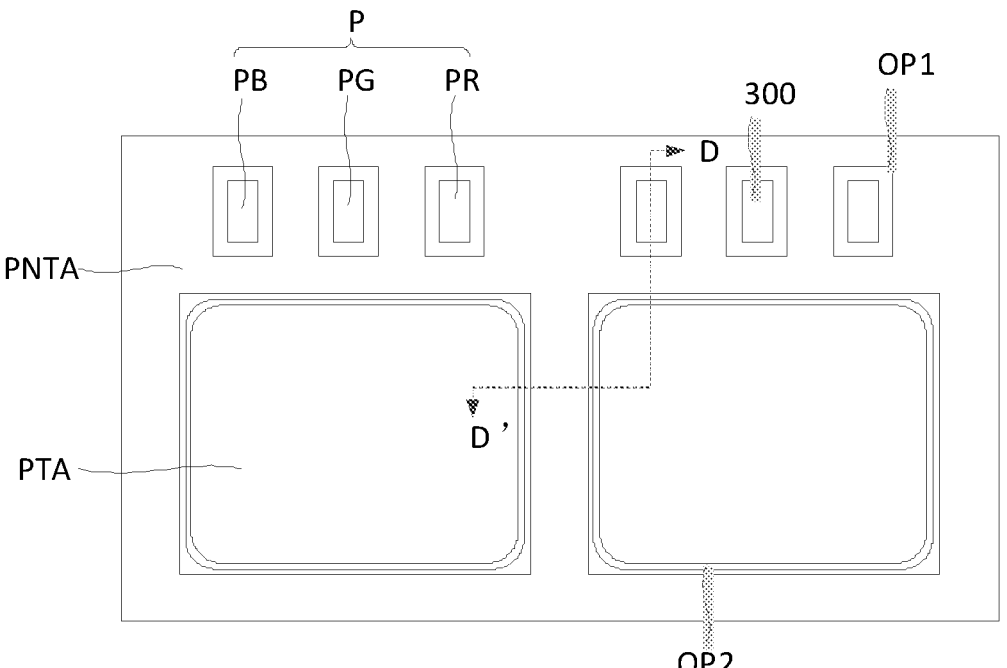
FIGS. 29-30 respectively illustrate other enlarged schematics of local regions of a display panel in FIG. 1.
Figure 30:
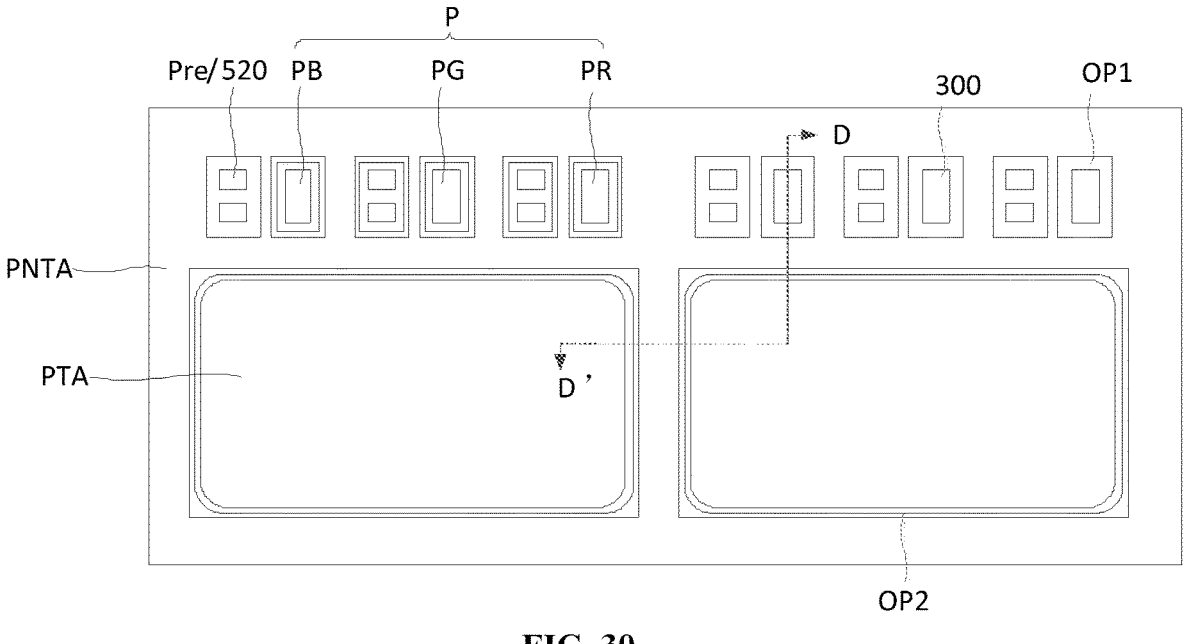
Figure 31:
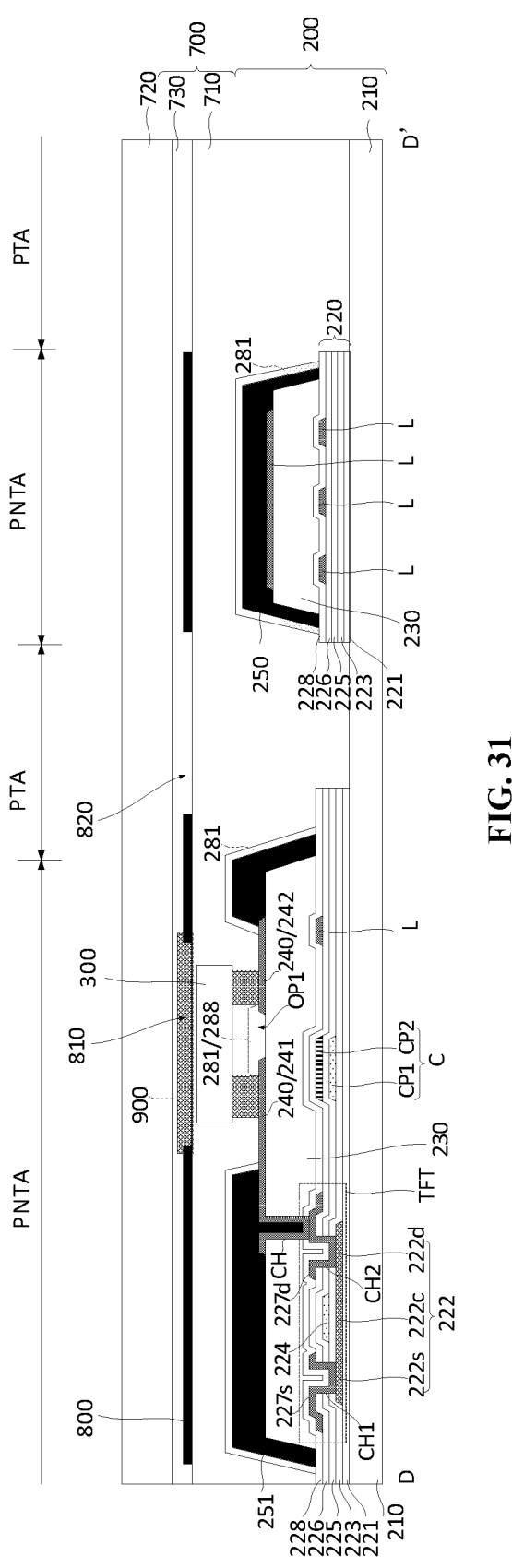
FIG. 31 illustrates a cross-sectional view along a line DD' in FIG. 29 or FIG. 30.
Figure 32:
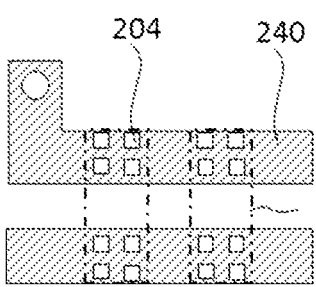
Figure 33:
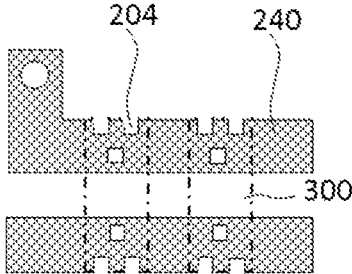

FIG. 28 illustrates a local top view of a drive substrate according to various embodiments of the present disclosure. FIGS. 29-30 respectively illustrate other enlarged schematics of local regions of a display panel in FIG. 1. FIG. 31 illustrates a cross-sectional view along a line DD' in FIG. 29 or FIG. 30. The parts in FIGS. 29-31 that are same as above-mentioned drawings may refer to above-mention description, which may not be described in detail herein.

The display panel may include a pixel light-transmitting region PTA and a non-light-transmitting region PNTA; and the non-light-transmitting region PNTA may include a light-emitting element configuration region.

The light-emitting element configuration region may be the region for bonding the light-emitting elements 300. As shown in FIG. 29, the light-emitting element configuration region may include regions for respectively configuring a blue light-emitting element PB, a green light-emitting element PG, and a red light-emitting element PR. In addition, as shown in FIG. 30, the light-emitting element configuration region may include regions for respectively configuring the blue light-emitting element PB, the green light-emitting element PG, and the red light-emitting element PR, and include the redundant electrode Pre. When the bonded light-emitting element 300 fails, normal light-emitting element 300 may be re-bonded in the redundant electrode Pre for repair (the light-emitting element for subsequent repair is temporarily referred to as a backup light-emitting element in other embodiments of the present disclosure). Two connection parts 240 in the redundant electrode Pre may be respectively connected to two connection parts 240 in adjacent light-emitting element configuration region respectively.

The blue light-emitting element PB, the green light-emitting element PG, and the red light-emitting element PR may be used to form the pixel SP.

The first film layer 250 may include a light-absorbing material and transmit light through the openings. The first film layer 250 may be provided with the first opening OP1 and the second opening OP2; the first opening OP1 may define the light-emitting element configuration region; and the second opening OP2 may define the pixel light-transmitting region PTA.

The planarization layer 230 (optionally, the second auxiliary layer 282) may be provided with the fourth opening. The fourth opening may be overlapped with the pixel light-transmitting region PTA, and the first film layer 250 may cover the sidewall of the fourth opening of the planarization layer 230 for blocking light and reducing reflection.

The first auxiliary layer 281 may cover the sidewall of the first opening OP1 and the sidewall of the second opening OP2 of the first film layer 250.

The first auxiliary layer 281 may be provided with the fifth opening. The fifth opening may be in the pixel light-transmitting region PTA, and the shape of the fifth opening may be a rectangle with four corners removed, for example, a rounded rectangle. By using such solution, it may improve the situation of holes in the first organic layer or holes in the first auxiliary layer caused by the high-level difference at the edge of the pixel light-transmitting region PTA, as well as other issues including the leakage of the removal solution, over-etching of four corners, and the like.

Optionally, in some optional embodiments of the present disclosure which may refer to relevant drawings related to the encapsulation layer 700 provided in the present disclosure, the drive substrate 200 may include the redundant electrode Pre. Since the eutectic process does not occur, the redundant electrode Pre may be the second electrode part 520. In one embodiment, the redundant electrode Pre may include gold (Au).

Optionally, in some optional embodiments of the present disclosure which may refer to relevant drawings related to the encapsulation layer 700 provided in the present disclosure, the display panel may further include the encapsulation layer 700. The encapsulation layer 700 may include an encapsulation adhesive 710 and a cover plate 720. The encapsulation adhesive 710 may cover the drive substrate 200 and be used to encapsulate the light-emitting element 300. The encapsulation adhesive 710 may cover the side surface of the light-emitting element 300 and may also cover the upper surface of the light-emitting element 300.

It should be noted that, in other drawings that do not illustrate the encapsulation layer 700, the encapsulation layer 700 may also be disposed above the drive substrate of the display panel, and specific structure of the encapsulation layer 700 may be referred to related drawings.

Optionally, in some optional embodiments of the present disclosure which may refer to relevant drawings related to the encapsulation layer 700 provided in the present disclosure, the display panel may further include a black matrix 800. The black matrix 800 may be on the side of the encapsulation adhesive 710 away from the drive substrate 200. The black matrix 800 may be provided with the first light-transmitting hole 810 and the second light-transmitting hole 820; the first light-transmitting hole 810 may be in the light-emitting element configuration region; and the second light-transmitting hole 820 may be in the pixel light-transmitting region PTA. The black matrix 800 may be in a mesh shape; and the first light-transmitting hole 810 and the second light-transmitting hole 820 may be meshes. The black matrix 800 may reduce the reflectivity of the display panel while reducing the crosstalk between the light-emitting elements 300.

Along the second direction, the distance between the edge of the first light-transmitting hole 810 and the light-emitting element 300 may be less than the distance between the edge of the first opening OP1 and the light-emitting element 300, where the second direction is in parallel with the plane of the display panel. With such configuration, the problem of high reflectivity caused by the connection part 240 in the first opening OP1 may be further improved.

Optionally, in some optional embodiments of the present disclosure which may refer to relevant drawings related to the encapsulation layer 700 provided in the present disclosure, the encapsulation layer 700 of the display panel may further include an adhesive layer 730; and the adhesive layer 730 may be between the encapsulation adhesive 710 and the cover plate 720.

Optionally, in some optional embodiments of the present disclosure which may refer to relevant drawings related to the encapsulation layer 700 provided in the present disclosure, the display panel may further include a color resist 900 covering the light-emitting element 300, which is configured to filter light and improve light purity.

Optionally, in some optional embodiments of the present disclosure which may refer to relevant drawings related to the encapsulation layer 700 provided in the present disclosure, the drive substrate may further include the redundant electrode Pre. Since the eutectic process does not occur, the redundant electrode Pre may be the second electrode part 520. In one embodiment, the redundant electrode Pre may include gold (Au), and the color resist 900 may cover the redundant electrode Pre, thereby reducing the influence of the redundant electrode Pre on the reflectivity of the display panel.

The color resistors 900 may include a blue color resistor 910, a green color resistor 920 and a red color resistor 930; and the light-emitting elements 300 may include a blue light-emitting element PB, a green light-emitting element PG and a red light-emitting element PR. The blue color resist 910 may cover the blue light-emitting element PB, the green color resist 920 may cover the green light-emitting element PG, and the red color resist 930 may cover the red light-emitting element PR. In other embodiments, the red color resistance may not be disposed. On one hand, the light extraction efficiency of the red light-emitting element may be low, and the addition of the red color resistance may further reduce the light extraction efficiency of the light-emitting element. On the other hand, most of the wavelength bands of the light reflected by the redundant electrode Pre or the connection part 240 may be wavelength bands of reddish light, even if the red color resist is disposed, the anti-reflection effect may be extremely limited.

FIGS. 32-38 illustrate local enlarged top views and related cross-sectional views of a display panel, respectively.

Optionally, the drive substrate may include a plurality of electrodes 240 exposed by the first opening OP1; and the electrode 240 may have the groove 204. That is, a concave-convex structure may be formed on the upper surface of the electrode 240.

In one embodiment, since the eutectic layer flows under the action of high temperature and external force when the light-emitting element is bonded, the electrode may be patterned, and the adhesion between the eutectic layer and the electrode may be increased through the patterning of the electrode and the concave-convex structure on the side of the electrode.

Optionally, the opening of the groove 204 may face the light-emitting element 300.

It should be noted that the dotted box in the drawings represents the region where the light-emitting element or the backup light-emitting element is disposed; and two electrodes 240 may correspond to a same light-emitting element 300, which may refer to specific description above.

FIGS. 35 to 38 illustrate the cross-sectional views along the cross-section line at position ①️ and the cross-section line at position ②️; and also illustrate different groove modes, that is, hollow grooves and non-hollow grooves. The cross-section direction is perpendicular to the plane direction of the display panel.

Optionally, the groove 204 may be a groove which passes through a part of the electrode 240 or a groove which does not pass through the electrode 240. The passing-through direction is a direction perpendicular to the plane of the display panel.

As shown in FIG. 36, the groove 204 may be a non-passing-through groove 204.

Optionally, as shown in FIGS. 33 and 35-38, at least a part of the groove 204 may pass through the edge of the electrode 240. That is, the pattern of the orthographic projection of the groove on the substrate may include an opening connected to the outside of the electrode. In other words, there is a notch in the outer contour of the electrode. In one embodiment, an opening may be designed on the outside of the electrode, which may guide the eutectic layer to flow toward the outside of the light-emitting element, and lead out the overflowing eutectic layer, which may avoid short circuit between the cathode and anode of the light-emitting element.

Optionally, in the electrode 240 corresponding to a same light-emitting element 300, the electrode 240 may include a first edge A facing away from the other electrode 240, and the groove 204 may pass through a part of the first edge A. The inventors had found that if the light-emitting element is bonded and then undergoes a high-temperature process, the eutectic layer may reflow, resulting in an increase in dark spots. In one embodiment, no drainage opening may be designed between the cathode and anode electrodes of the LED (light-emitting diode), and only a drainage opening may be designed around the LED. In such way, the overflowing eutectic layer may be controlled to be led out, and the overflowing eutectic layer of different electrodes may be guided along the direction away from the other electrode, which may further optimize the effect of preventing short circuit.

Figure 34:
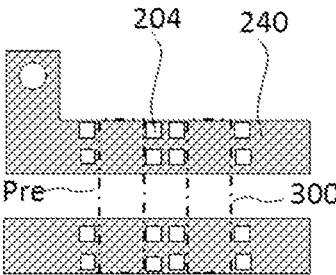
Figure 37:
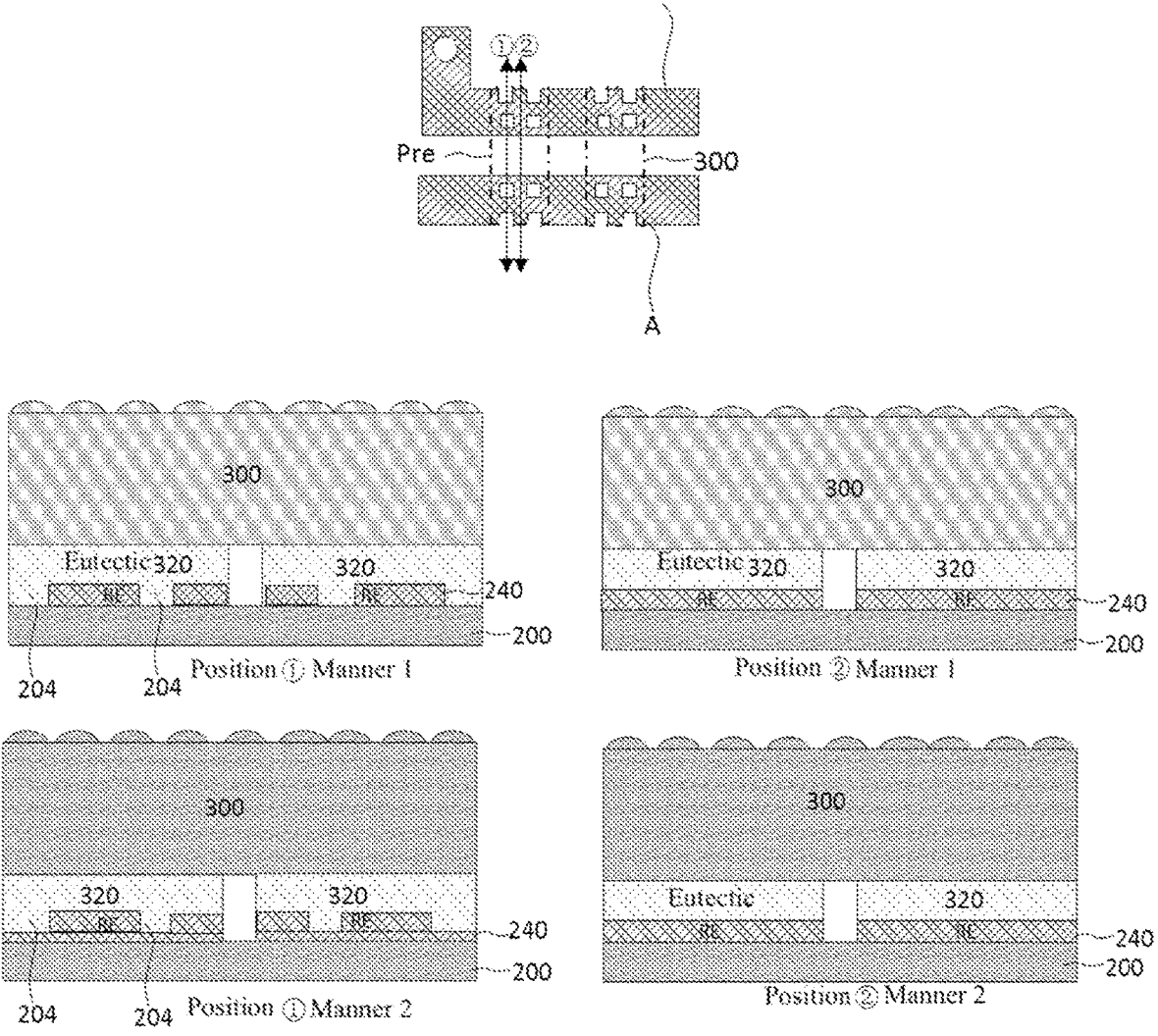

Optionally, as shown in FIG. 34, the connection positions between the grooves 204 and the light-emitting element 300 may not be overlapped with each other.

Optionally, at least a part of the grooves 204 may be between the redundant configuration region and the light-emitting element 300. In such way, the fabrication of subsequent backup light-emitting element that affects the redundant configuration region may be prevented from being affected by the eutectic layer of the light-emitting element fabricated previously.

Figure 39:
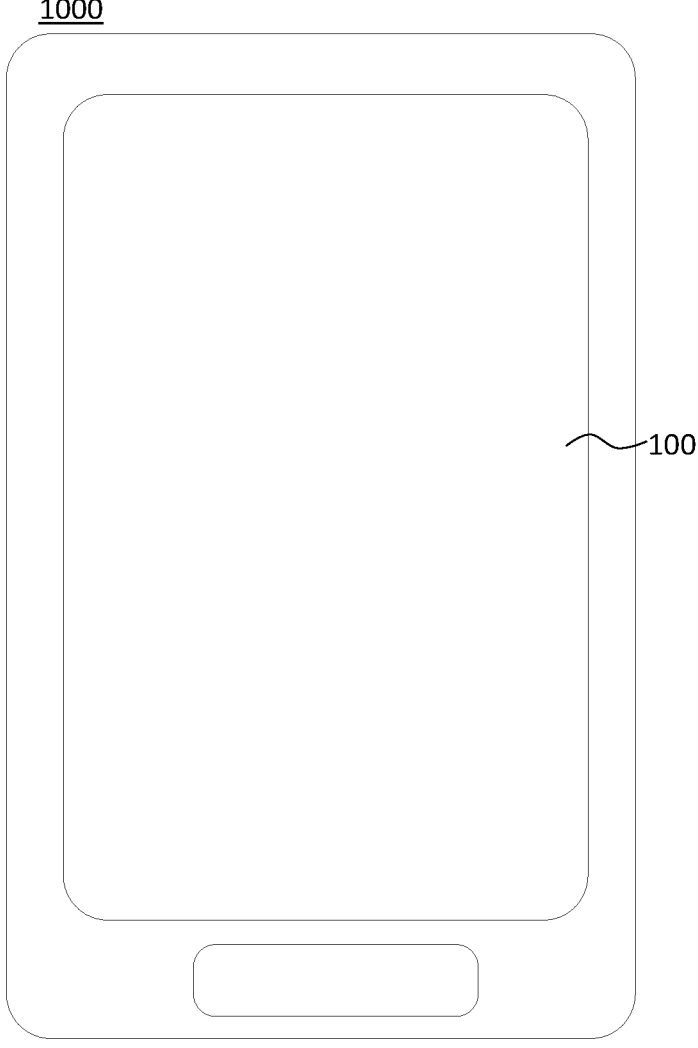
FIG. 39 illustrates a schematic of a display apparatus according to various embodiments of the present disclosure.

The present disclosure also provides a display apparatus including the display panel provided by the present disclosure. FIG. 39 illustrates a schematic of a display apparatus according to various embodiments of the present disclosure. The display apparatus 1000 may include the display panel 100 provided by any one of above embodiments of the present disclosure. Embodiment of FIG. 39 only takes a mobile phone as an example to describe the display apparatus 1000. It may be understood that the display apparatus provided by embodiments of the present disclosure may be a computer, a TV, a vehicle-mounted display apparatus, or other display apparatus having a display function, which may not be limited by the present disclosure. The display apparatus provided by embodiments of the present disclosure may have the beneficial effects of the display panel provided by embodiments of the present disclosure, which may refer to description of the display panel in above-mentioned embodiments and may not be described in detail in one embodiment.

The reliability of the display panel may be improved through the present disclosure.

The above is a further detailed description of the present disclosure in conjunction with optional embodiments, and the implementation of the present disclosure may not be limited to such description. For those skilled in the art, without departing from the concept of the present disclosure, certain simple deductions or substitutions may be made which should be regarded as the protection scope of the present disclosure.

What is claimed is:

1. A display panel, comprising:

a substrate;

a drive substrate on the substrate, wherein the drive substrate includes a first film layer; and the first film layer includes a first opening; and a light-emitting element on the drive substrate, wherein the light-emitting element is disposed corresponding to the first opening, wherein:

the drive substrate further includes an auxiliary film layer; and the auxiliary film layer includes a thickened part, a thinned part, or a hollow part overlapped with the first opening, and the drive substrate further includes a connection part disposed between the first film layer and the substrate and electrically connected to a thin film transistor, wherein the first opening exposes at least a first portion of the connection part and the first film layer covers at least a second portion of the connection part.

2. The display panel according to claim 1, wherein:

the first film layer includes an organic material.

3. The display panel according to claim 1, wherein:

the first film layer includes a negative photoresist.

4. The display panel according to claim 1, wherein:

the first film layer includes a light-absorbing material.

5. The display panel according to claim 1, wherein:

the auxiliary film layer is adjacent to the first film layer.

6. The display panel according to claim 1, wherein:

the auxiliary film layer includes a first auxiliary layer on a side of the first film layer away from the substrate; and/or the auxiliary film layer includes a second auxiliary layer on a side of the first film layer facing toward the substrate.

7. The display panel according to claim 6, wherein:

the first auxiliary layer is made of an organic material.

8. The display panel according to claim 6, wherein:

a density of the first auxiliary layer is higher than a density of the first film layer.

9. The display panel according to claim 6, wherein:

the first auxiliary layer is overlapped with at least a part of sidewalls of the first opening.

10. The display panel according to claim 6, wherein:

the first auxiliary layer includes a first hollow part; and the first hollow part is within a coverage region of the first opening.

11. The display panel according to claim 6, wherein:

the drive substrate includes a plurality of electrodes exposed by the first opening; and the plurality of electrodes corresponds to different hollow parts included in the hollow part, respectively.

12. The display panel according to claim 6, wherein:

the drive substrate includes a plurality of electrodes exposed by the first opening; and the first auxiliary layer includes a separation element between adjacent electrodes of the plurality of electrodes.

13. The display panel according to claim 12, wherein:

a distance from a top surface of the separation element to a top surface of the adjacent electrodes is L, wherein L≤4 μm is satisfied.

14. The display panel according to claim 12, wherein:

a thickness h of the separation element is greater than a thickness d1 of the first auxiliary layer in an upper region of the first film layer.

15. The display panel according to claim 12, wherein:

a sum of thicknesses of the first film layer and the first auxiliary layer is H, and a thickness of the separation element is h, wherein h≤½*H is satisfied.

16. The display panel according to claim 6, wherein:

a sum of thicknesses of the first film layer and the first auxiliary layer is H, wherein H≤4 μm is satisfied.

17. The display panel according to claim 12, wherein:

a width of the separation element is D, wherein D≤5 μm is satisfied; and a width direction points from an electrode adjacent of the plurality of electrodes to one side of the separation element to another electrode adjacent of the plurality of electrodes to another side of the separation element.

18. The display panel according to claim 12, wherein:

the second auxiliary layer includes a second thinned part; and the separation element is overlapped with the second thinned part.

19. The display panel according to claim 6, wherein:

the second auxiliary layer includes a second thickened part in the first opening.

20. The display panel according to claim 6, wherein:

the drive substrate includes a plurality of electrodes exposed by the first opening; and at least a part of the plurality of electrodes is on the thickened part.

21. The display panel according to claim 6, wherein:

the second auxiliary layer includes a plurality of thickened parts; and the plurality of thickened parts are in a one-to-one correspondence with at least a part of light-emitting elements.

22. The display panel according to claim 6, wherein:

the second auxiliary layer includes a plurality of thickened parts; and at least a part of the plurality of thickened parts corresponding to different light-emitting elements is continuous.

23. The display panel according to claim 1, wherein:

the drive substrate includes a plurality of electrodes exposed by the first opening; and an electrode of the plurality of electrodes includes a groove.

24. The display panel according to claim 23, wherein:

the groove passes through or does not pass through the electrode of the plurality of electrodes.

25. The display panel according to claim 23, wherein:

an edge of the groove passes through a portion of an edge of the electrode of the plurality of electrodes.

26. The display panel according to claim 25, wherein:

in electrodes of the plurality of electrodes corresponding to a same light-emitting element, the electrode of the plurality of electrodes includes a first edge facing away from another electrode of the plurality of electrodes, and the groove passes through a portion of the first edge.

27. The display panel according to claim 23, wherein:

the groove is not overlapped with a connection position of the light-emitting element.

28. The display panel according to claim 1, wherein:

the display panel includes a light-transmitting region and a non-light-transmitting region; and the non-light-transmitting region includes a light-emitting element configuration region; and the first film layer further includes a second opening; and the second opening defines a pixel light-transmitting region of a pixel.

29. A display apparatus, comprising:

a display panel, comprising:

a substrate;

a drive substrate on the substrate, wherein the drive substrate includes a first film layer; and the first film layer includes a first opening; and a light-emitting element on the drive substrate, wherein the light-emitting element is disposed corresponding to the first opening, wherein:

the drive substrate further includes an auxiliary film layer; and the auxiliary film layer includes a thickened part, a thinned part, or a hollow part overlapped with the first opening, and the drive substrate further includes a connection part disposed between the first film layer and the substrate and electrically connected to a thin film transistor, wherein the first opening exposes at least a first portion of the connection part and the first film layer covers at least a second portion of the connection part.

* * * * *